(12) United States Patent
Makiyama

(10) Patent No.: US 10,014,385 B2
(45) Date of Patent: Jul. 3, 2018

(54) MANUFACTURING METHOD OF SEMICONDUCTOR DEVICE AND SEMICONDUCTOR DEVICE

(71) Applicant: Renesas Electronics Corporation, Koutou-ku, Tokyo (JP)

(72) Inventor: Hideki Makiyama, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/717,397

(22) Filed: Sep. 27, 2017

(65) Prior Publication Data
US 2018/0019315 A1  Jan. 18, 2018

Related U.S. Application Data

(62) Division of application No. 15/361,037, filed on Nov. 24, 2016, now Pat. No. 9,806,165.

(30) Foreign Application Priority Data

Feb. 2, 2016 (JP) ................................ 2016-017816

(51) Int. Cl.
| | | |
|---|---|---|
| H01L 29/49 | (2006.01) |
| H01L 21/66 | (2006.01) |
| H01L 23/522 | (2006.01) |
| H01L 27/12 | (2006.01) |
| H01L 21/02 | (2006.01) |
| H01L 21/768 | (2006.01) |
| H01L 29/66 | (2006.01) |

(Continued)

(52) U.S. Cl.
CPC ...... *H01L 29/4983* (2013.01); *H01L 21/0217* (2013.01); *H01L 21/02164* (2013.01); *H01L 21/265* (2013.01); *H01L 21/31111* (2013.01); *H01L 21/31144* (2013.01); *H01L 21/76802* (2013.01); *H01L 21/76877* (2013.01); *H01L 21/84* (2013.01); *H01L 22/20* (2013.01); *H01L 22/30* (2013.01); *H01L 23/5226* (2013.01); *H01L 27/1203* (2013.01); *H01L 29/665* (2013.01)

(58) Field of Classification Search
CPC .......................... H01L 29/4983; H01L 29/665
See application file for complete search history.

(56) References Cited

U.S. PATENT DOCUMENTS

| | | |
|---|---|---|
| 9,130,039 B2 | 9/2015 | Yamamoto et al. |
| 2013/0264644 A1 | 10/2013 | Tsunomura et al. |

FOREIGN PATENT DOCUMENTS

| | | |
|---|---|---|
| JP | 2013-219181 A | 10/2013 |
| JP | 2014-038878 A | 2/2014 |

*Primary Examiner* — Douglas Menz
(74) *Attorney, Agent, or Firm* — Shapiro, Gabor and Rosenberger, PLLC

(57) ABSTRACT

The thickness of an insulating film, which will serve as an offset spacer film and is formed in an offset monitor region, is managed as the thickness of an offset spacer film formed over the side wall surface of a gate electrode of an SOTB transistor STR, etc. When the measured thickness is within the tolerance of a standard thickness, standard implantation energy and a standard dose amount are set. When the measured thickness is smaller than the standard thickness, implantation energy and a dose amount, which are respectively lower than the standard values thereof, are set. When the measured thickness is larger than the standard thickness, implantation energy and a dose amount, which are respectively higher than the standard values thereof, are set.

4 Claims, 30 Drawing Sheets

(51) Int. Cl.
*H01L 21/265* (2006.01)
*H01L 21/311* (2006.01)
*H01L 21/84* (2006.01)

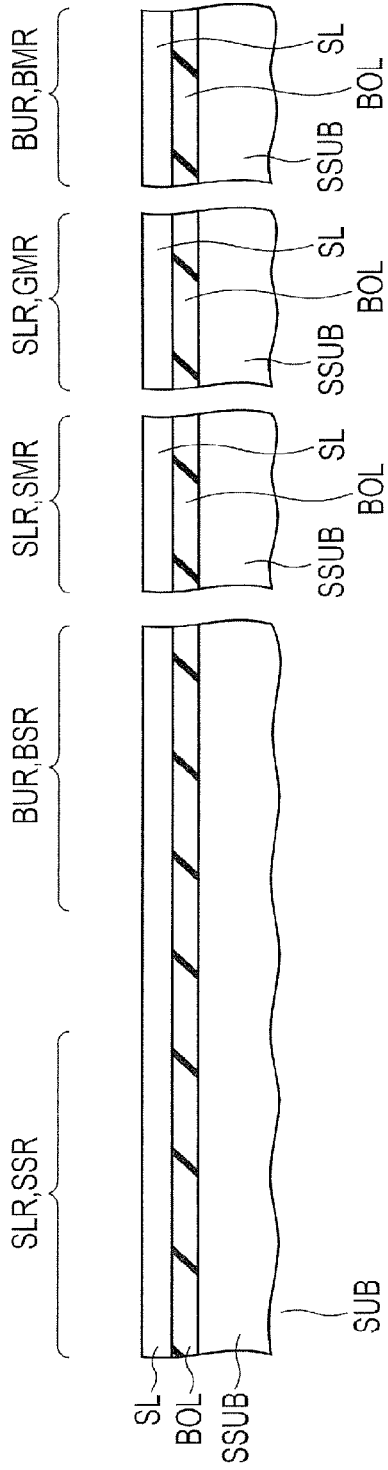
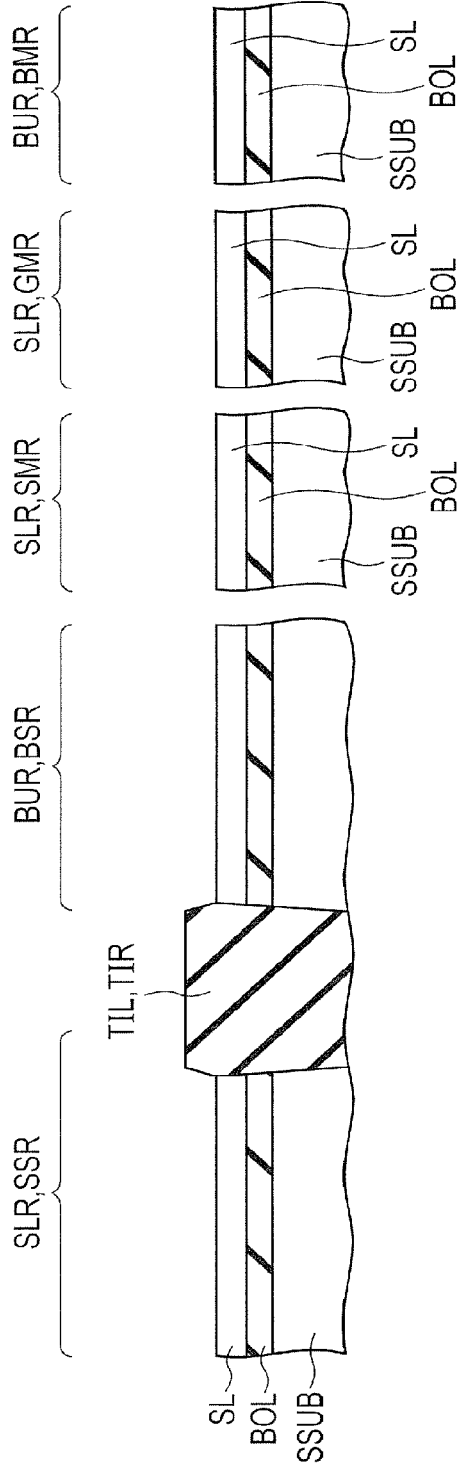

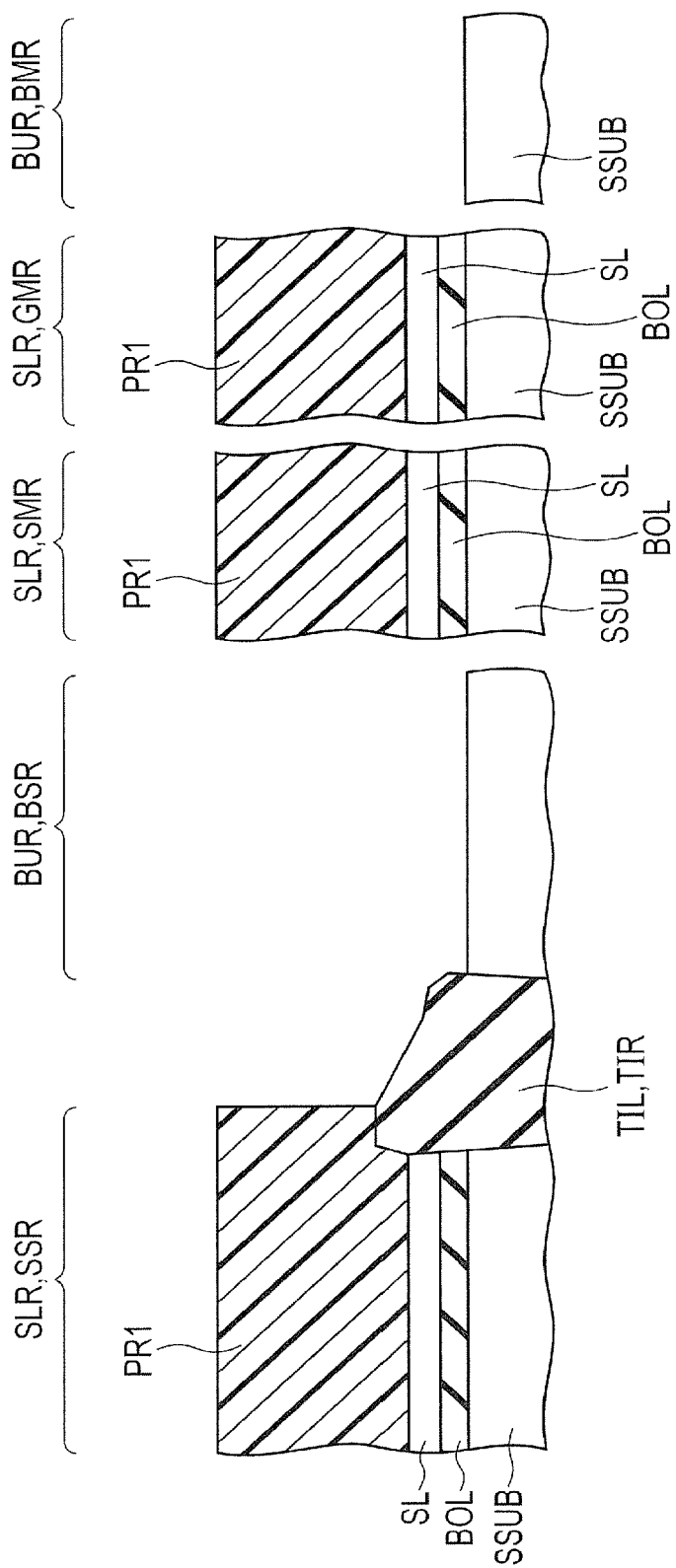

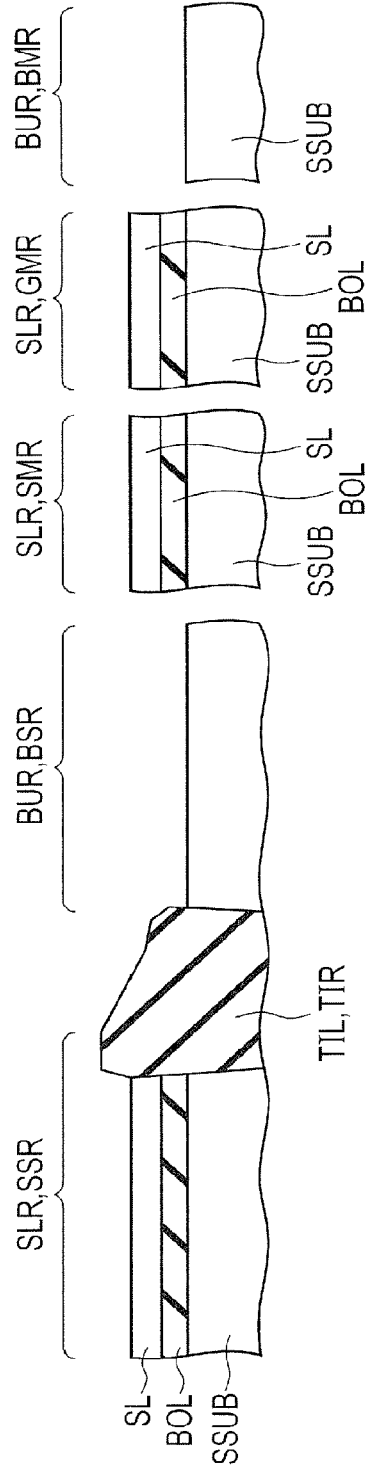
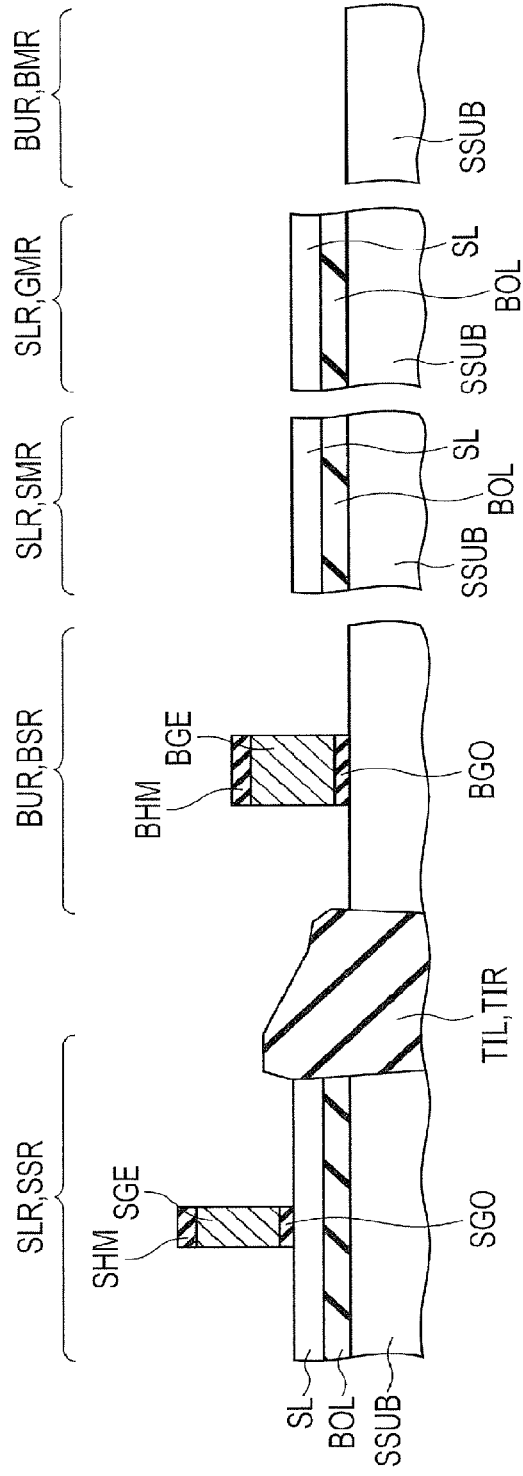

| | DOSE AMOUNT | |
|---|---|---|
| STANDARD | (diagram with labels: L, OSS, SGE, T, SGO, SETR, R, SL, LL) | |
| COMPARATIVE EXAMPLE | DOSE AMOUNT = STANDARD VALUE<br>(L−ΔL, OSS, SGE, T−ΔT, SGO, SETR, R−ΔR, SL, LL) | DOSE AMOUNT = STANDARD VALUE<br>(L+ΔL, OSS, SGE, T+ΔT, SGO, SETR, R+ΔR, SL, LL) |
| EMBODIMENT | DOSE AMOUNT < STANDARD VALUE<br>(L−ΔL, OSS, SGE, T−ΔT, SGO, SETR, R, SL, LL) | DOSE AMOUNT > STANDARD VALUE<br>(L+ΔL, OSS, SGE, T+ΔT, SGO, SETR, R, SL, LL) |

MANUFACTURING METHOD OF SEMICONDUCTOR DEVICE AND SEMICONDUCTOR DEVICE

CROSS-REFERENCE TO RELATED APPLICATIONS

The disclosure of Japanese Patent Application No. 2016-017816 filed on Feb. 2, 2016 including the specification, drawings and abstract is incorporated herein by reference in its entirety.

BACKGROUND

The present invention relates to a manufacturing method of a semiconductor device and a semiconductor device, and can be preferably used in a manufacturing method of a semiconductor device and in the semiconductor device in which, for example, an electric field effect type transistor is formed in an SOI region by using an SOI substrate.

Semiconductor devices to be applied to low power consumption devices are under development. In such a semiconductor device, an SOI substrate is used. An electric field effect type transistor is formed in a silicon layer over the SOI substrate. The electric field effect type transistor of this type is referred to as a SOTB (Silicon on Thin Buried Oxide) MISFET (Metal Insulator Semiconductor Field effect transistor). In this specification, this electric field effect type transistor is written as a "SOTB transistor". Examples of the patent documents describing a SOTB transistor include Patent Documents 1 and 2.

In the SOTB transistor, it is required that a variation (local variation) in the microscopic or local impurity concentration of a region where the channel directly under a gate electrode is to be formed be reduced. In order to stably operate a low power consumption device with a low voltage and a low leakage current, it is necessary to reduce not only this local variation, but a global variation. The global variation means a variation in chips (processes) or in lots (processes).

RELATED ART DOCUMENTS

Patent Documents

[Patent Document 1] Japanese Unexamined Patent Application Publication No. 2014-38878
[Patent Document 2] Japanese Unexamined Patent Application Publication No. 2013-219181

SUMMARY

The present inventors have evaluated transistor characteristics associated with variations in SOTB transistors. As a result, it has been found that a variation in transistor characteristics, occurring due to a variation in the thickness of an offset spacer film, is relatively large.

The offset spacer film is an insulating film formed over the side wall surface of a gate electrode, etc. By implanting impurities into a silicon layer with the use of the offset spacer film and the gate electrode as an implantation mask, the extension region of the SOTB transistor is formed.

The thickness of the offset spacer film is managed by the thickness of an insulating film to serve as an offset spacer film to be formed in a monitor region. The thickness of the insulating film to serve as the offset spacer film is measured immediately after being formed in the monitor region. The monitor region is arranged in a bulk region. In the monitor region, the thickness of the insulating film to serve as the offset spacer film varies by the processes (steps) performed between the formation of the insulating film which is to be the offset spacer film and the carrying out of extension implantation.

Accordingly, the thickness of the insulating film may be different from the original one when the extension implantation is performed. That is, a difference is caused between the thickness of the insulating film formed in the monitor region and the thickness of the actual offset spacer film, and the measured thickness varies with respect to the thickness of the actual offset spacer film.

If the thickness measured as the thickness of the offset spacer film varies, the overlap length between the extension region and the gate electrode and the resistance of the extension region vary. As a result, the characteristics (current characteristic, etc.) of the SOTB transistor vary.

Other problems and new characteristics will become clear from the description and accompanying drawings of the present specification.

A manufacturing method of a semiconductor device according to one embodiment includes the following steps. A plurality of regions including a first element formation region and a first monitor region are defined in a semiconductor substrate, over the surface of which a semiconductor layer is formed by interposing a buried insulating film. A plurality of gate electrodes are formed, including the step of forming a first gate electrode in the semiconductor layer located in the first element formation region. A laminated insulating film including a first insulating film is formed, the laminated insulating film covering each of the surface of the semiconductor layer and the side wall surface of the first gate electrode in the first element formation region and covering the substrate in the first monitor region. A first mask member is formed, the mask member exposing the laminated insulating film located in the first element formation region and covering the laminated insulating film located in the first monitor region. A first process is performed on the laminated insulating film, including a step in which, by performing an etching process on the laminated insulating film with the use of the first mask member as an etching mask: a first sidewall insulating film including the offset spacer film including the first insulating film is formed to cover the side wall surface of the first gate electrode and the semiconductor layer in the first element formation region; and the laminated insulating film is left in the first monitor region. After the first mask member is removed, an elevated epitaxial layer is formed over the surface of the exposed semiconductor layer located in the first element formation region by an epitaxial growth process. A second process is performed on the laminated insulating film, including a step in which: a film other than the offset spacer film of the first sidewall insulating film is removed in the first element formation region; and a film other than the first insulating film of the laminated insulating film is removed in the first monitor region. The thickness of the first insulating film located in the first monitor region is measured. Implantation conditions for forming an extension region are set based on the thickness. The extension region is formed in the semiconductor layer located in the first element formation region by implanting impurities based on the set implantation conditions.

A semiconductor device according to another embodiment includes a substrate, a plurality of regions, a first transistor, an offset spacer film, and an interlayer insulating film. The substrate has a semiconductor substrate and a semiconductor layer formed over the surface of the semiconductor substrate by interposing a buried insulating film. The regions include a first element formation region and a first monitor region that are defined in the semiconductor layer. The first transistor includes a first gate electrode, an extension region, and a first impurity region that are formed in the first element formation region. The offset spacer film is formed to cover the side wall surface of the first gate electrode and the extension region. The interlayer insulating film is formed to cover the first transistor. In the first element formation region, the offset spacer film includes a first insulating film first part formed to contact the surface of the side wall surface of the first gate electrode and the surface of the extension region. In the first monitor region, a first insulating film second part is formed to contact the surface of the semiconductor layer.

A semiconductor device according to still another embodiment includes a substrate, a plurality of regions, a first transistor, an offset spacer film, and an interlayer insulating film. The substrate has a semiconductor substrate and a semiconductor layer formed over the surface of the semiconductor substrate by interposing a buried insulating film. The regions include a first element formation region defined in the semiconductor layer and a first monitor region defined in the semiconductor substrate. The first transistor includes a first gate electrode, an extension region, and a first impurity region that are formed in the first element formation region. The offset spacer film is formed to cover the side wall surface of the first gate electrode and the extension region. The interlayer insulating film is formed to cover the first transistor. In the first element formation region, the offset spacer film includes a first insulating film first part formed to contact the surface of the side wall surface of the first gate electrode and the surface of the extension region. In the first monitor region, a first insulating film second part is formed to contact the surface of the semiconductor substrate.

Advantage of the Invention

According to a manufacturing method of a semiconductor device of one embodiment, a variation in the characteristics of a transistor having a first gate electrode and an extension region can be suppressed.

According to the semiconductor device of another embodiment, a variation in the characteristics of the first transistor can be suppressed.

According to the semiconductor device of still another embodiment, a variation in the characteristics of the first transistor can be suppressed.

BRIEF DESCRIPTION OF THE DRAWINGS

FIG. 4 is a sectional view illustrating one step of a manufacturing method of the semiconductor device according to the embodiment;

FIG. 5 is a sectional view illustrating a step performed after the step illustrated in FIG. 4, according to the embodiment;

FIG. 7 is a sectional view illustrating a step performed after the step illustrated in FIG. 6, according to the embodiment;

FIG. 8 is a sectional view illustrating a step performed after the step illustrated in FIG. 7, according to the embodiment;

FIG. 9 is a sectional view illustrating a step performed after the step illustrated in FIG. 8, according to the embodiment;

FIG. 28 is a view including a comparative example, the view for explaining a method of setting implantation energy, according to the embodiment;

FIG. 29 is a view including a comparative example, the view for explaining a method of setting a dose amount, according to the embodiment;

DETAILED DESCRIPTION

One example of a semiconductor device provided with a SOTB transistor using an SOI substrate, according to an embodiment, will be described.

Figure 1:
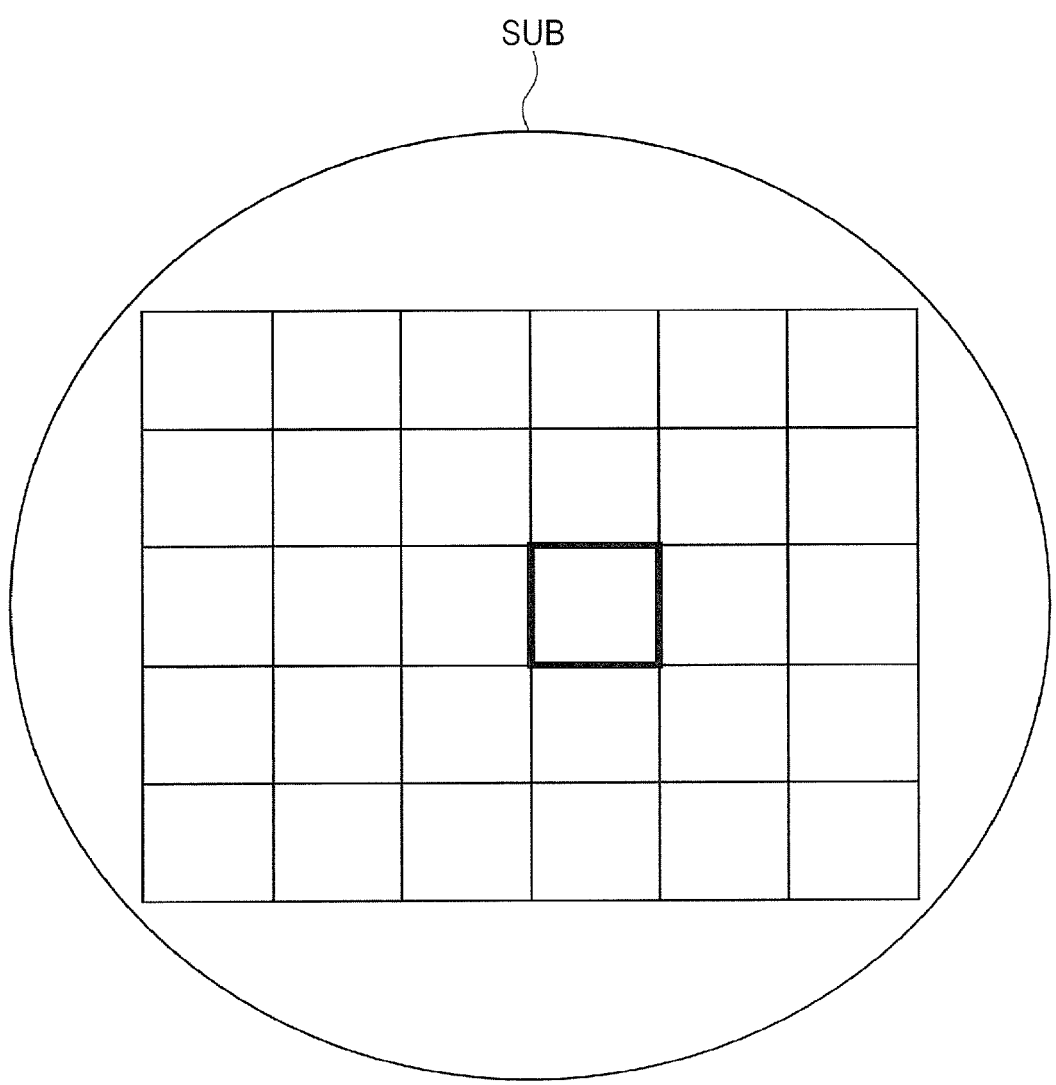
FIG. 1 is a plan view illustrating one example of the arrangement of a semiconductor device in an SOI substrate, according to an embodiment.
Figure 2:
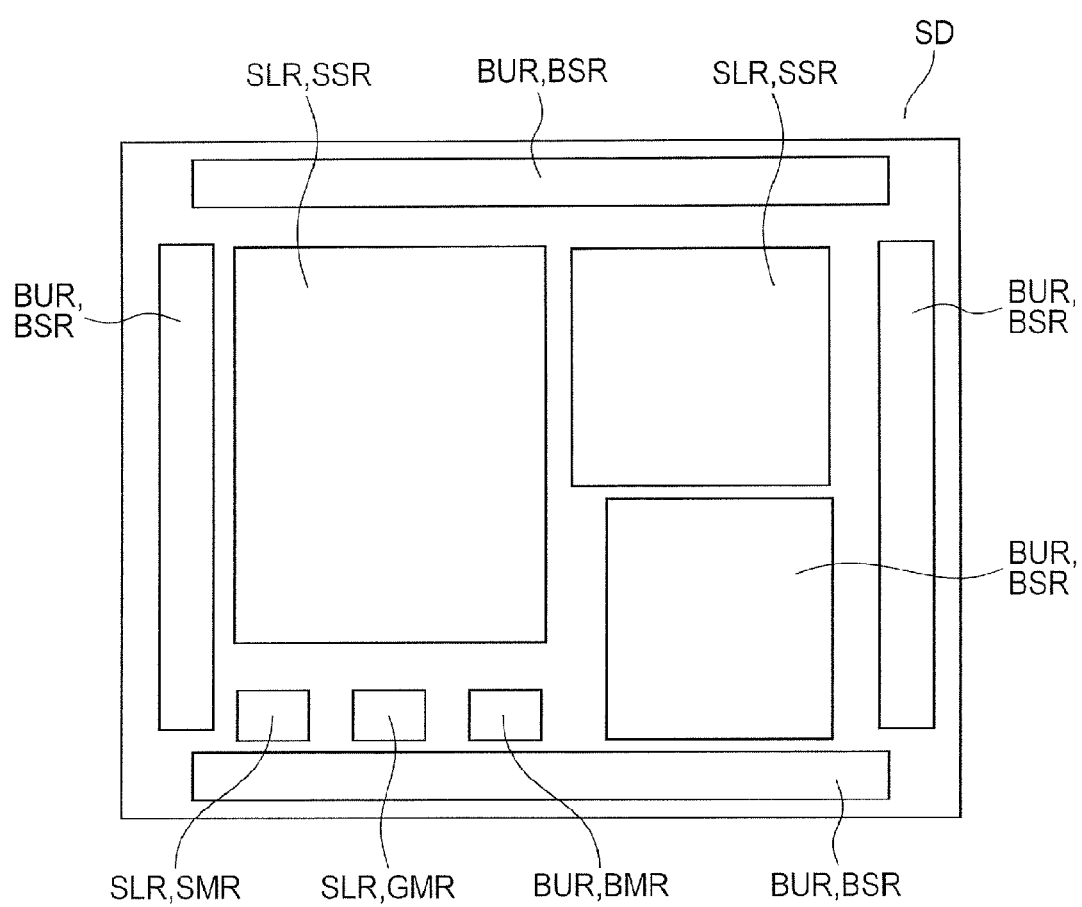
FIG. 2 is a plan view illustrating one example of a layout in a semiconductor device as a chip in the thick-lined frame illustrated in FIG. 1, according to the embodiment.

FIG. 1 illustrates one example of a pattern in which chips (semiconductor devices) formed in an SOI substrate SUB are arranged. One example of a planar layout pattern of one chip (thick frame) of the chips illustrated in FIG. 1 is illustrated in FIG. 2. As illustrated in FIGS. 1 and 2, an SOI region SLR and a bulk region BUR are defined in a semiconductor device SD. The SOI region SLR is a region where a silicon layer over the SOI substrate SUB is left. The bulk region BUR is a region in the silicon substrate where the silicon layer and a buried oxide film over the SOI substrate are removed.

In the SOI region SLR, for example, a core transistor formation region SSR is arranged as one of regions in each of which an SOI element is to be formed. In the core transistor formation region SSR, for example, an SOTB transistor is formed. In the SOI region SLR, an SOI monitor region SMR and an offset monitor region GMR are arranged.

As described later, for example, the thickness of a silicon epitaxial growth layer to be formed in the SOI monitor region SMR is managed as the thickness of an elevated epitaxial growth layer of the SOTB transistor STR (see FIG. 3). The thickness of an insulating film to serve as an offset spacer film formed in the offset monitor region GMR is managed as the thickness of an offset spacer film formed over the side wall surface of the gate electrode of the SOTB transistor STR (see FIG. 3), etc.

On the other hand, for example, a bulk transistor formation region BSR is arranged as one of regions in each of which a bulk element is to be formed, in the bulk region BUR. For example, a bulk transistor BTR (see FIG. 3) is formed in the bulk transistor formation region BSR. A bulk monitor region BMR is arranged in the bulk region BUR. As described later, for example, the thickness of a silicon oxide film to be formed in the bulk monitor region BMR is managed as the thickness of a gate oxide film of the bulk transistor BTR (see FIG. 3).

Subsequently, one example of the structure of each of the SOI region SLR and the bulk region BUR in the semiconductor device SD will be described in more detail.

Figure 3:
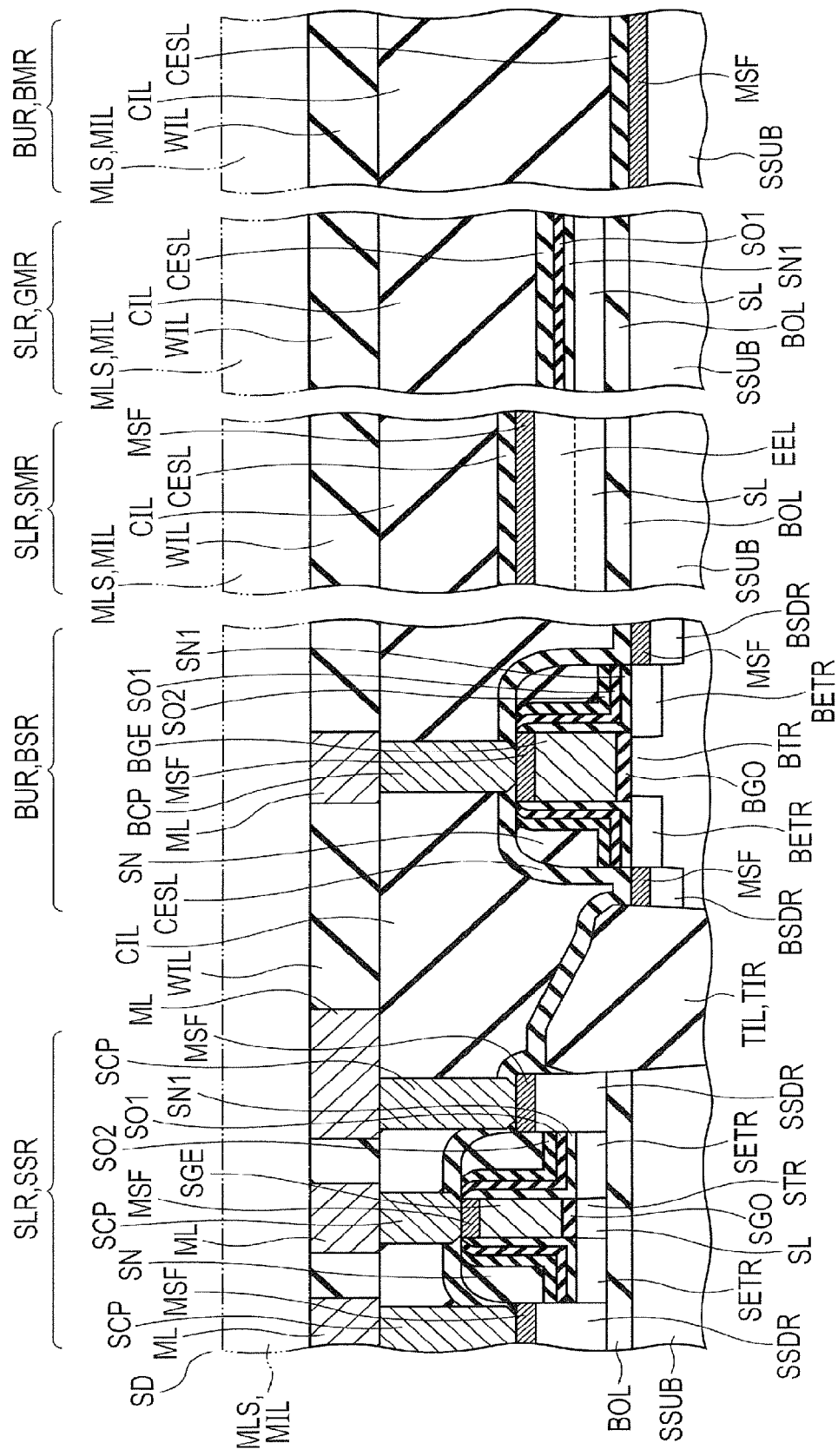
FIG. 3 is a sectional view of the semiconductor device according to the embodiment.

As illustrated in FIG. 3, the SOTB transistor STR is formed in the core transistor formation region SSR of the SOI region SLR. A gate electrode SGE is formed over a silicon layer SL by interposing a gate oxide film SGO.

A silicon nitride film SN1, a silicon oxide film SO1, a silicon oxide film SO2, and a silicon nitride film SN are formed to cover the side wall surface of the gate electrode SGE and the surface of the silicon layer SL. Of these insulating films, the silicon nitride film SN1, the silicon oxide film SO1, and the silicon oxide film SO2 will serve as an offset spacer film OSS (see FIG. 14), as described later.

Extension regions SETR and source/drain regions SSDR are formed on both sides of the gate electrode SGE. The extension region SETR is formed in the silicon layer SL located directly under the silicon nitride film SN1 (part of the offset spacer film). The source/drain region SSDR is formed in an elevated epitaxial layer EEL (see FIG. 12). A metal silicide film MSF is formed over the surface of each of the gate electrode SGE and the source/drain region SSDR.

The bulk transistor BTR is formed in the bulk transistor formation region BSR of the bulk region BUR. A gate electrode BGE is formed over a silicon substrate SSUB by interposing a gate oxide film BGO. The silicon nitride film SN1, the silicon oxide film SO1, the silicon oxide film SO2, and the silicon nitride film SN are formed to cover the side wall surface of the gate electrode BGE and the surface of the silicon substrate SSUB.

Extension regions BETR and source/drain regions BSDR are formed on both sides of the gate electrode BGE. The extension region BETR and the source/drain region BSDR are formed in the silicon substrate SSUB. The metal silicide film MSF is formed over the surface of each of the gate electrode BGE and the source/drain region BSDR.

The metal silicide film MSF is formed over the surface of the elevated epitaxial layer EEL in the SOI monitor region SMR of the SOI region SLR. Part of the insulating film to serve as the offset spacer film is left in the offset monitor region GMR. The silicon nitride film SN1 is formed to contact the surface of the silicon layer SL. The silicon oxide film SO1 is formed to contact the silicon nitride film SN1. The metal silicide film is not formed in the offset monitor region GMR. The metal silicide film MSF is formed over the surface of the silicon substrate SSUB in the bulk monitor region BMR of the bulk regions BUR.

In the semiconductor device SD, a silicon nitride film CESL is formed to cover the SOTB transistor STR and the bulk transistor BTR. A contact interlayer insulating film CIL is formed to cover the silicon nitride film CESL. A contact plug SCP, which penetrates the contact interlayer insulating film CIL to reach the metal silicide film MSF, is formed in the core transistor formation region SSR. On the other hand, a contact plug BCP, which penetrates the contact interlayer insulating film CIL to reach metal silicide film MSF, is formed in the bulk transistor formation region BSR.

A wiring interlayer insulating film WIL is formed to cover the contact interlayer insulating film CIL. A wire ML is formed in a wiring trench in the wiring interlayer insulating film WIL. In the core transistor formation region SSR, one wire ML is electrically coupled to one source/drain region SSDR via the contact plug SCP. Another wire ML is electrically coupled to the other source/drain region SSDR via the contact plug SCP. Still another wire ML is electrically coupled to the gate electrode SGE via the contact plug SCP. In the bulk transistor formation region BSR, the wire ML is electrically coupled to the gate electrode BGE via the contact plug BCP.

Over the wire ML, a multi-layer wiring structure including a multi-layer wire MLS and a multi-layer interlayer insulating film MIL is further formed, if necessary. A semiconductor device provided with the SOTB transistor is formed as described above.

Subsequently, one example of a manufacturing method of the above semiconductor device provided with the SOTB transistor will be described.

As illustrated in FIG. 4, the SOI substrate SUB is first provided. In the SOI substrate SUB, the silicon layer SL is formed in the silicon substrate SSUB by interposing a buried oxide film BOL. Subsequently, a trench (not illustrated) is formed in a predetermined region in the SOI substrate SUB. Subsequently, a trench isolation region TIR is formed by forming a trench isolation insulating film TIL in the trench, as illustrated in FIG. 5. The SOI region SLR and the bulk region BUR are defined by the trench isolation region TIR.

Figure 6:
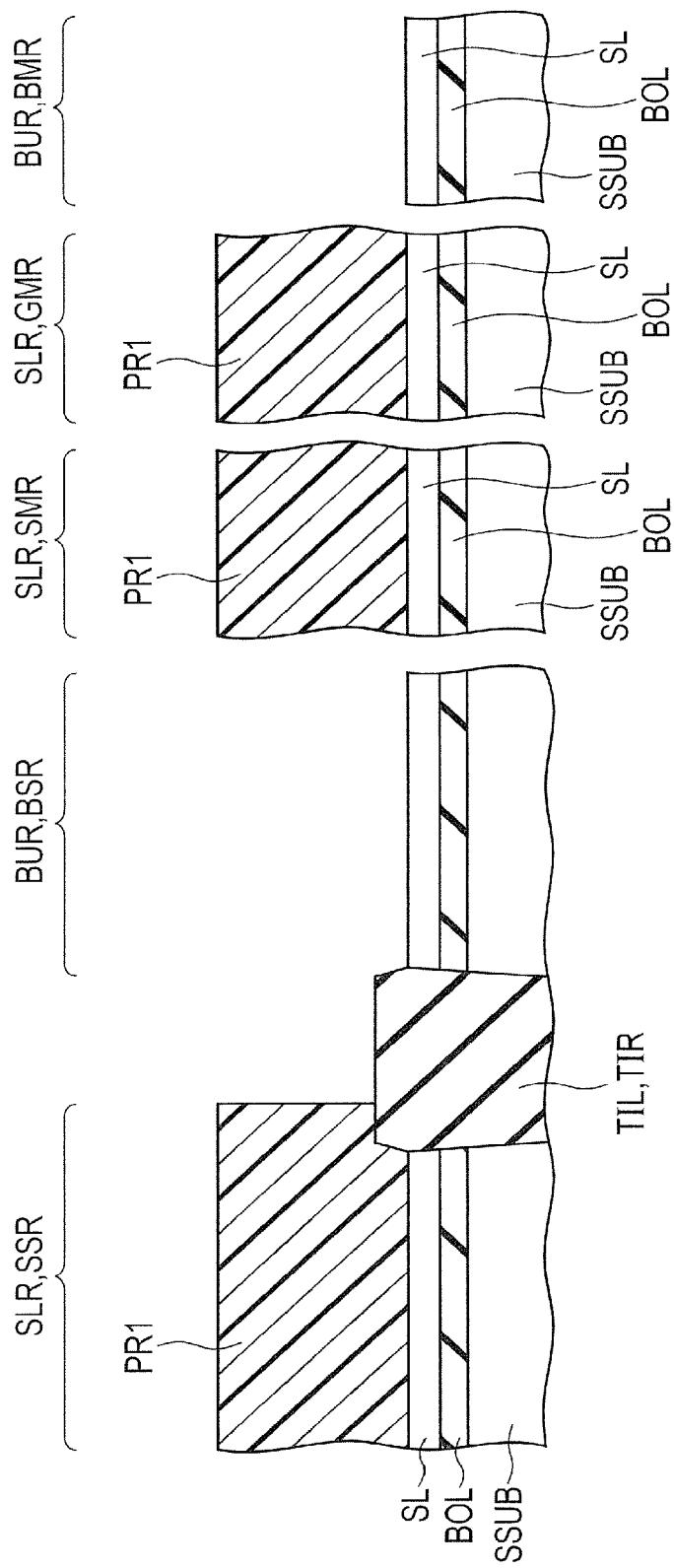
FIG. 6 is a sectional view illustrating a step performed after the step illustrated in FIG. 5, according to the embodiment.

Subsequently, a resist pattern PR1, which exposes a region to serve as the bulk region BUR and covers a region to serve as the SOI region SLR, is formed by performing a predetermined photoengraving process, as illustrated in FIG. 6. Subsequently, the exposed silicon layer SL and the buried oxide film BOL are removed by performing an etching process with the use of the resist pattern PR1 as an etching mask, as illustrated in FIG. 7. Thereby, the silicon substrate SSUB is exposed, so that the bulk region BUR is formed. Thereafter, the silicon layer SL is exposed by removing the resist pattern PR1, so that the SOI region SLR and the bulk region BUR are formed (defined), as illustrated in FIG. 8.

Subsequently, a silicon oxide film (not illustrated) is formed over the surface of each of the silicon layer SL and the silicon substrate SSUB by performing a heat treatment. In this case, the thickness of the silicon oxide film formed in the bulk monitor region BMR is managed as the thickness of the gate oxide film. Subsequently, a polysilicon film (not illustrated) is formed to cover the silicon oxide film. Subsequently, a silicon nitride film (not illustrated) to serve as a hard mask is formed to cover the polysilicon film.

Subsequently, hard masks SHM and BHM (see FIG. 9) for patterning a gate electrode are formed by performing predetermined photoengraving process and etching process on the silicon nitride film. Subsequently, an etching process is performed on the polysilicon film by using the hard masks SHM and BHM as an etching mask, as illustrated in FIG. 9. Thereby, the gate electrode SGE is formed over the silicon layer SL by interposing the gate oxide film SGO, in the core transistor formation region SSR. In the bulk transistor formation region BSR, the gate electrode BGE is formed over the silicon substrate SSUB by interposing the gate oxide film BGO.

Figure 10:
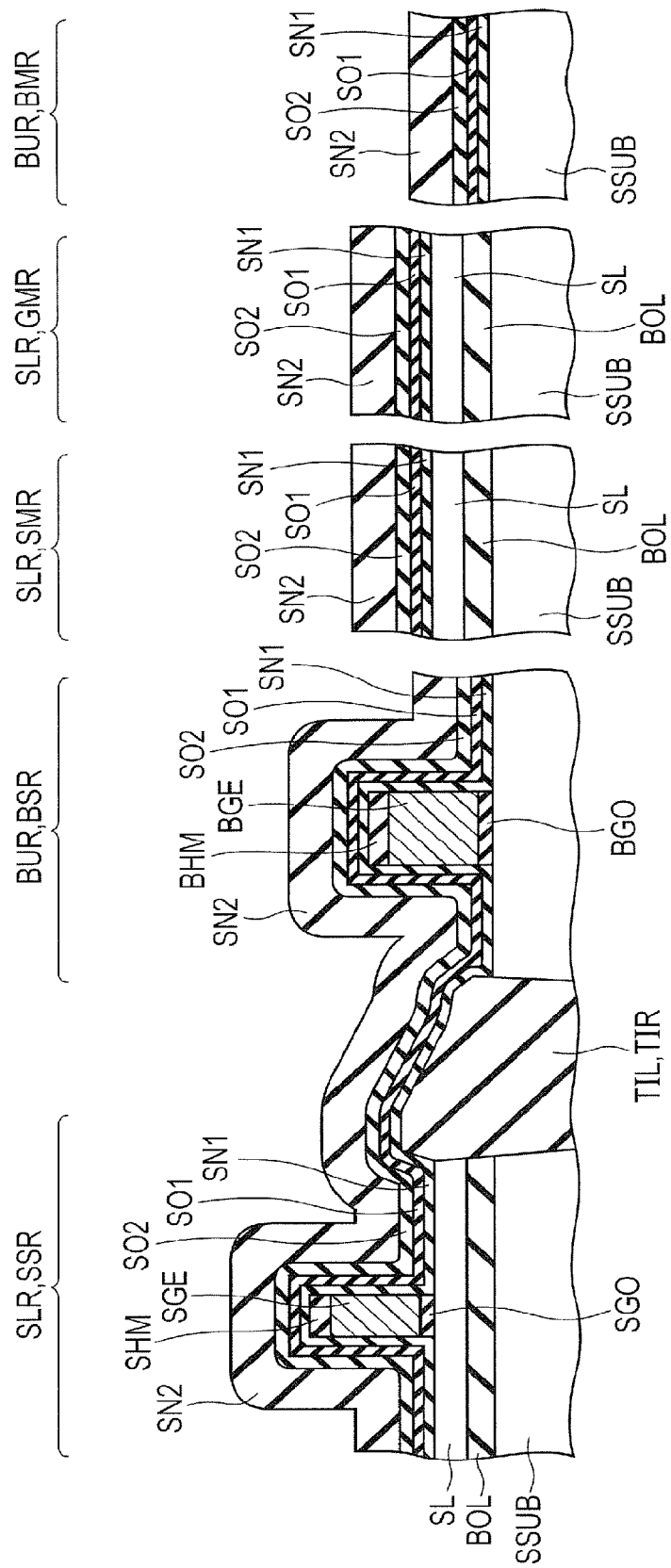
FIG. 10 is a sectional view illustrating a step performed after the step illustrated in FIG. 9, according to the embodiment.

Subsequently, the silicon nitride film SN1, the silicon oxide film SO1, the silicon oxide film SO2, and the silicon nitride film SN2 are sequentially formed as the laminated insulating film so as to cover the gate electrodes SGE and BGE, etc., by using, for example, a CVD (Chemical Vapor Deposition) process, as illustrated in FIG. 10. The silicon nitride film SN1, the silicon oxide film SO1, and the silicon oxide film SO2 are insulating films to serve as the offset spacer film.

Figure 11:
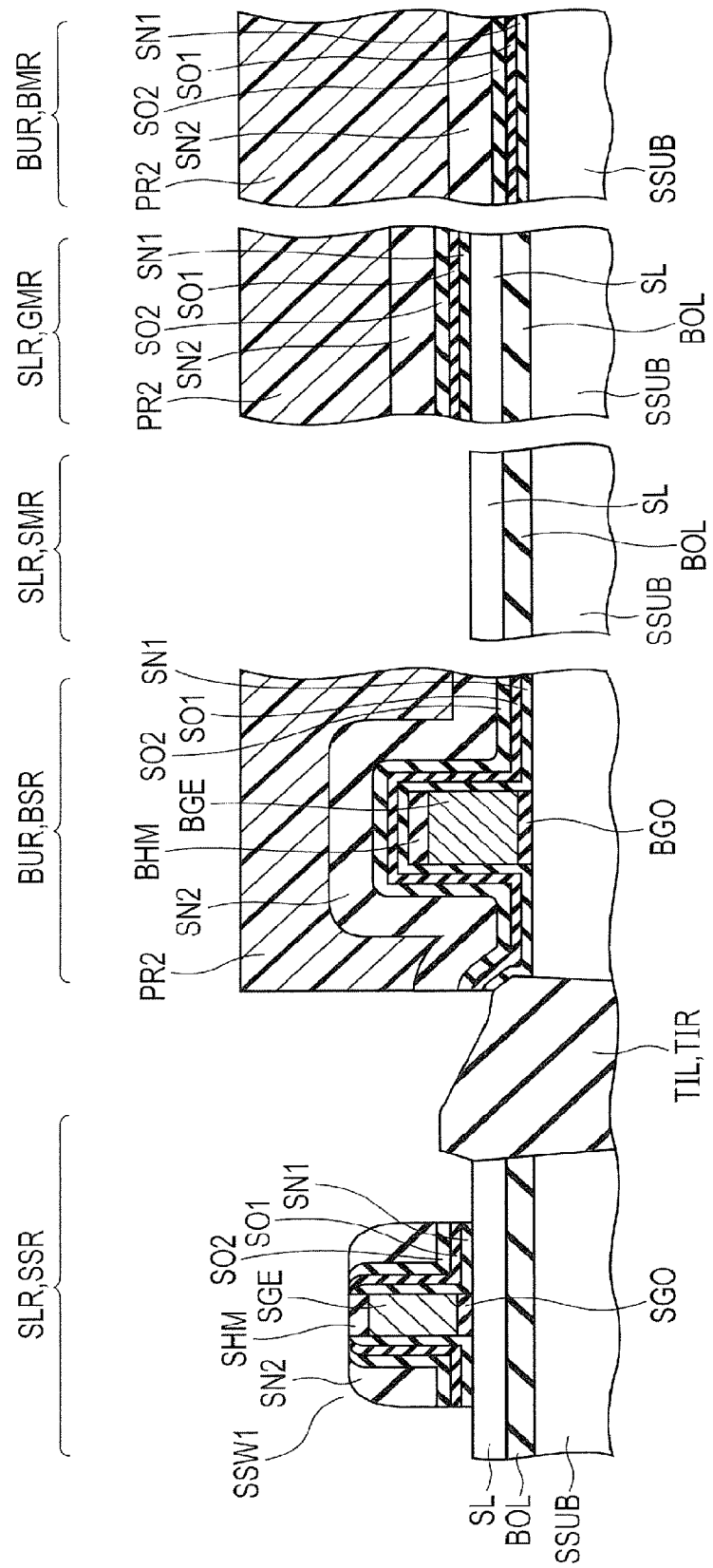
FIG. 11 is a sectional view illustrating a step performed after the step illustrated in FIG. 10, according to the embodiment.

Subsequently, a resist pattern PR2 (see FIG. 11), which covers the bulk transistor formation region BSR, the offset monitor region GMR, and the bulk monitor region BMR and exposes the core transistor formation region SSR and the SOI monitor region SMR, is formed by performing a predetermined photoengraving process. Subsequently, an etching process is performed on the exposed silicon nitride film SN2, silicon oxide film SO2, silicon oxide film 501, and silicon nitride film SN1 by using the resist pattern PR2 as an etching mask, as illustrated in FIG. 11.

Thereby, a sidewall insulating film SSW1, including the silicon nitride film SN2, the silicon oxide film SO2, the silicon oxide film SO1, and the silicon nitride film SN1, is formed over the side wall surface of the gate electrode SGE, in the core transistor formation region SSR. The sidewall insulating film SSW1 includes the offset spacer film including the silicon nitride film SN2, the silicon oxide film SO2, and the silicon oxide film SO1. The surface of the silicon layer SL is exposed in the SOI monitor region SMR. Thereafter, the resist pattern PR2 is removed.

Figure 12:
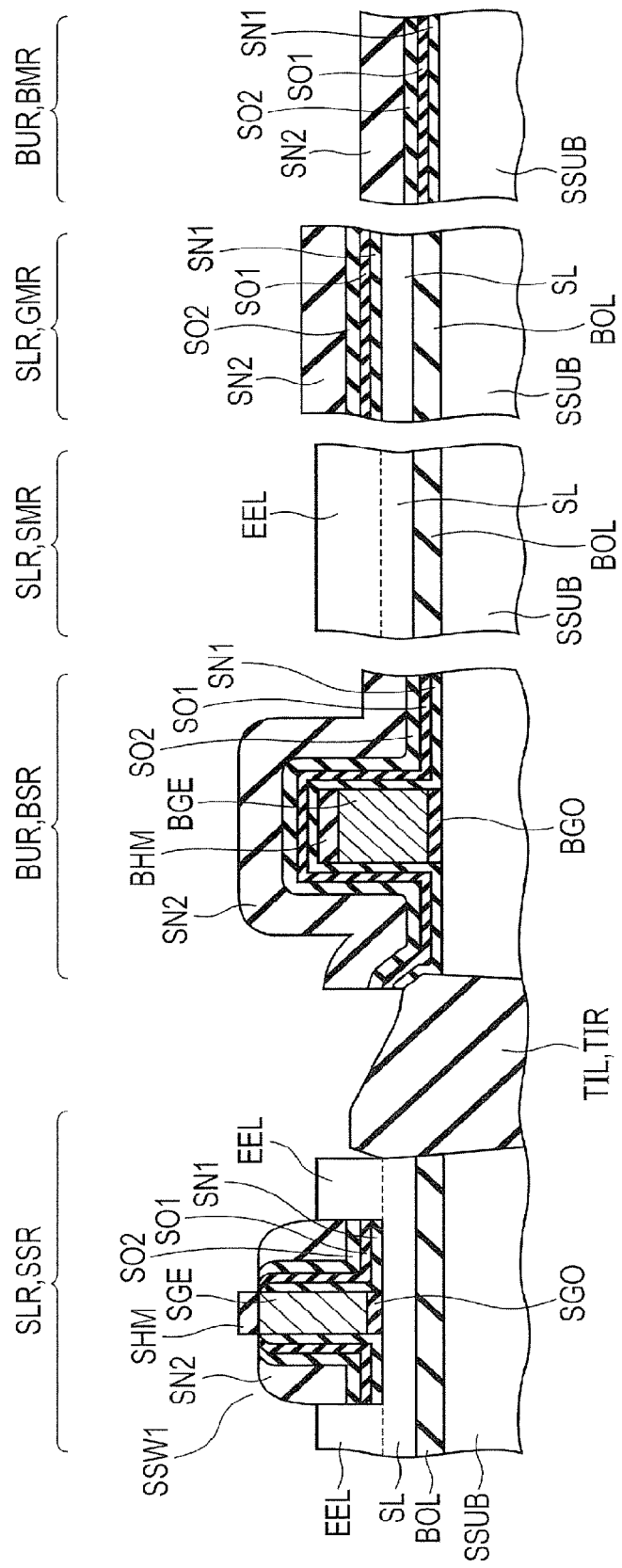
FIG. 12 is a sectional view illustrating a step performed after the step illustrated in FIG. 11, according to the embodiment.

Subsequently, the elevated epitaxial layer EEL is formed over the surface of the exposed silicon layer SL in the core transistor formation region SSR by an epitaxial growth process, as illustrated in FIG. 12. In the SOI monitor region SMR, the elevated epitaxial layer EEL is formed over the surface of the exposed silicon layer SL. The thickness of the elevated epitaxial layer EEL is managed by the thickness of the epitaxial layer formed in the SOI monitor region SMR.

Subsequently, a resist pattern PR3 (see FIG. 13), which covers the core transistor formation region SSR, the SOI monitor region SMR, and the offset monitor region GMR and exposes the bulk transistor formation region BSR and the bulk monitor region BMR, is formed by performing a predetermined photoengraving process.

Figure 13:
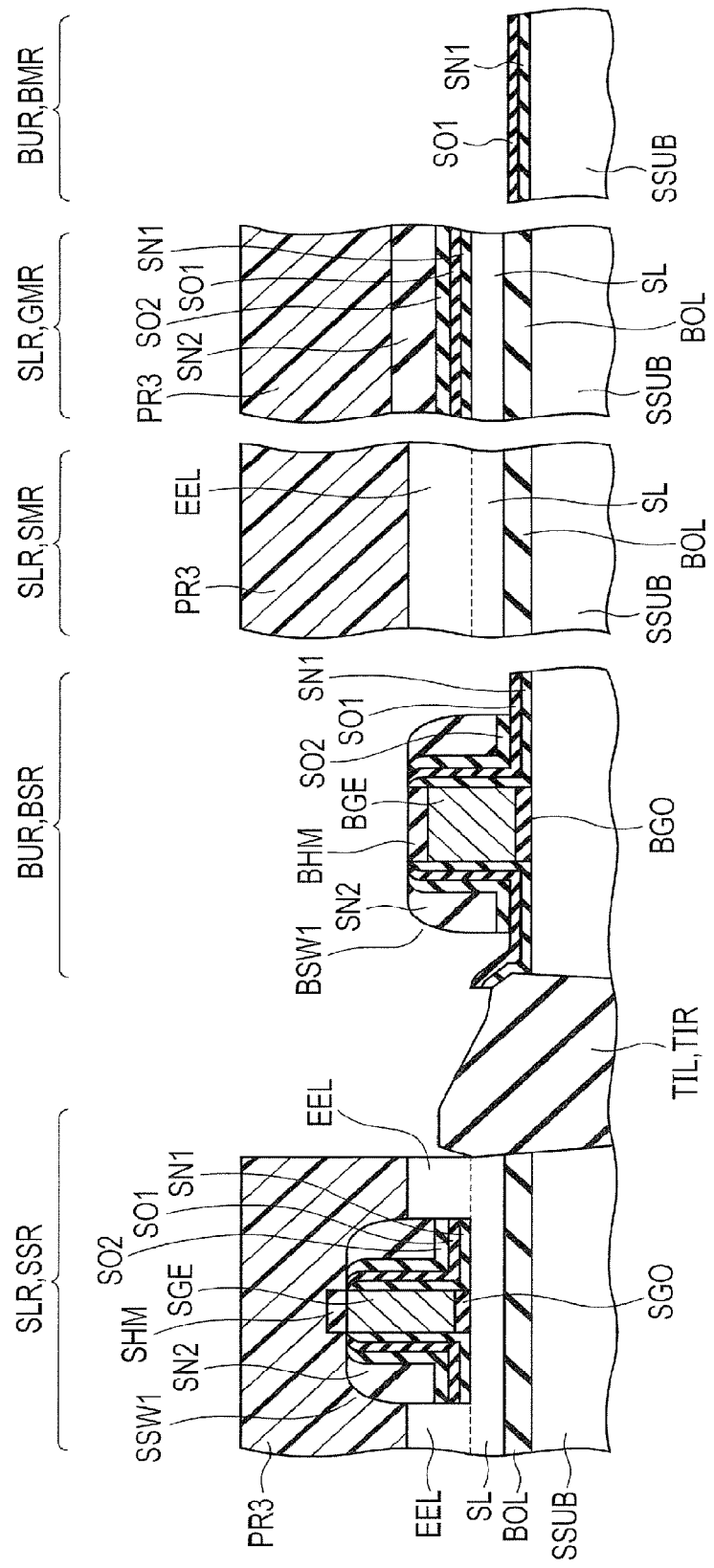
FIG. 13 is a sectional view illustrating a step performed after the step illustrated in FIG. 12, according to the embodiment.

Subsequently, an etching process is performed on the exposed silicon nitride film SN2 and silicon oxide film SO2 by using the resist pattern PR3 as an etching mask, as illustrated in FIG. 13. Thereby, a sidewall insulating film BSW1 is formed over the side wall surface of the gate electrode BGE in the bulk transistor formation region BSR. At the time, the silicon oxide film SO1 and the silicon nitride film SN1 that are located over the surface of silicon layer SL are left. Also in the bulk monitor region BMR, the silicon oxide film SO1 and the silicon nitride film SN1 are left. Thereafter, the resist pattern PR3 is removed.

Figure 14:
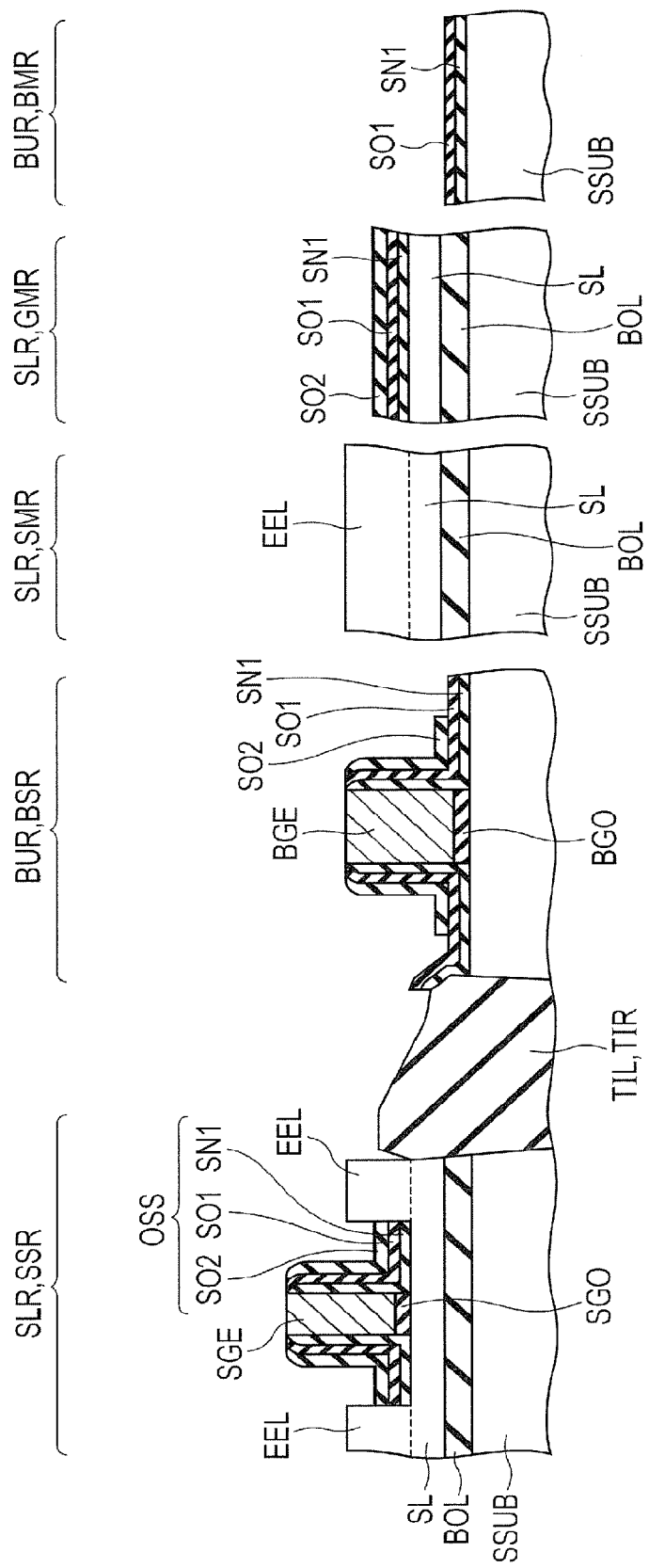
FIG. 14 is a sectional view illustrating a step performed after the step illustrated in FIG. 13, according to the embodiment.

Subsequently, the silicon nitride film SN2 is removed by performing a predetermined etching process, as illustrated in FIG. 14. Thereby, the offset spacer film OSS is exposed in the core transistor formation region SSR. In the offset monitor region GMR, the silicon nitride film SN1, the silicon oxide film SO1, and the silicon oxide film SO2, which are the same films as those of the offset spacer film OSS, are left.

Subsequently, the thickness of the insulating film, including the silicon nitride film SN1, the silicon oxide film SO1, and the silicon oxide film SO2 that are left in the offset monitor region GMR, is measured. This thickness is managed as the thickness of the offset spacer film OSS. The implantation conditions for the extension implantation to be performed in the following step are set by comparing the measured thickness with a standard thickness (maximum value and minimum value). A method of setting these implantation conditions will be described in detail later.

Figure 15:
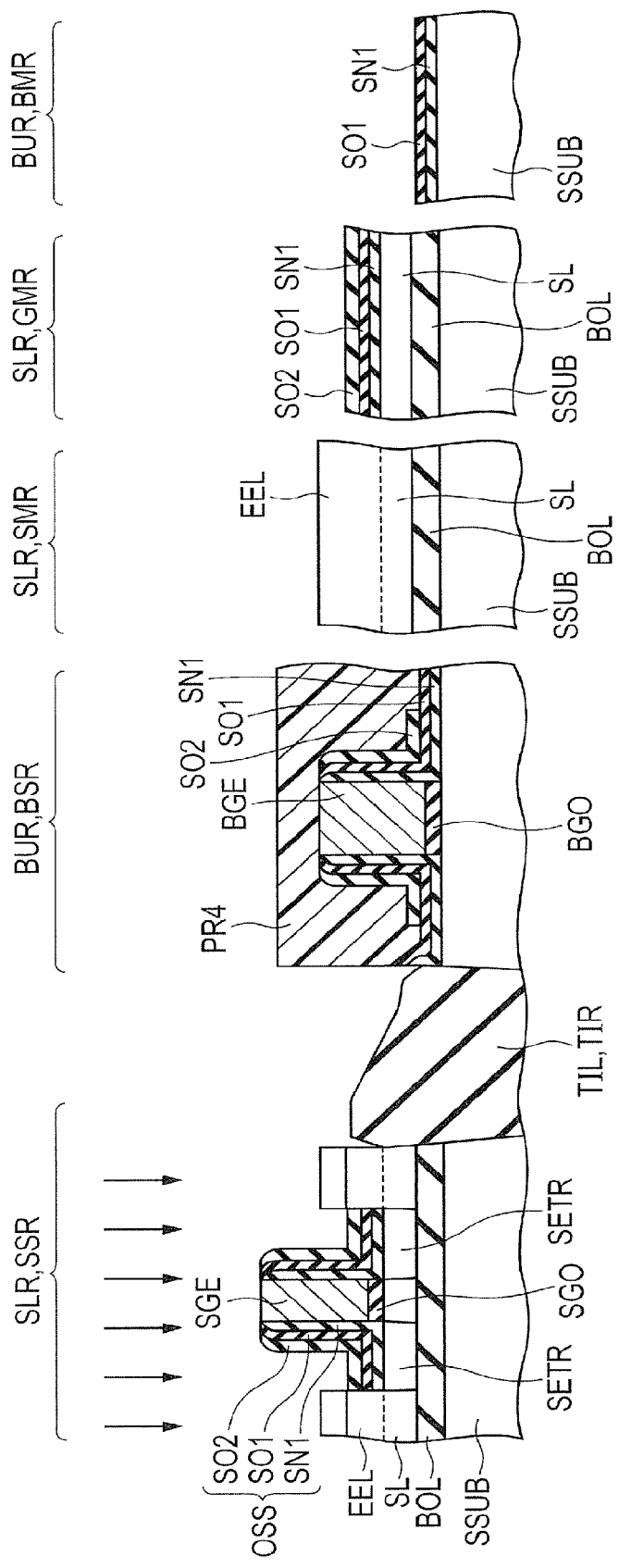
FIG. 15 is a sectional view illustrating a step performed after the step illustrated in FIG. 14, according to the embodiment.

Subsequently, a resist pattern PR4, which covers the bulk transistor formation region BSR and exposes the core transistor formation region SSR, etc., is formed by performing a predetermined photoengraving process, as illustrated in FIG. 15. Subsequently, extension implantation is performed by using the resist pattern PR4 as an implantation mask, based on the set implantation conditions. That is, the desired extension region SETR is formed in the silicon layer SL in the core transistor formation region SSR by implanting impurities with the preset implantation energy and dose amount such that the impurities pass through the offset spacer film OSS. Thereafter, the resist pattern PR4 is removed.

Figure 16:
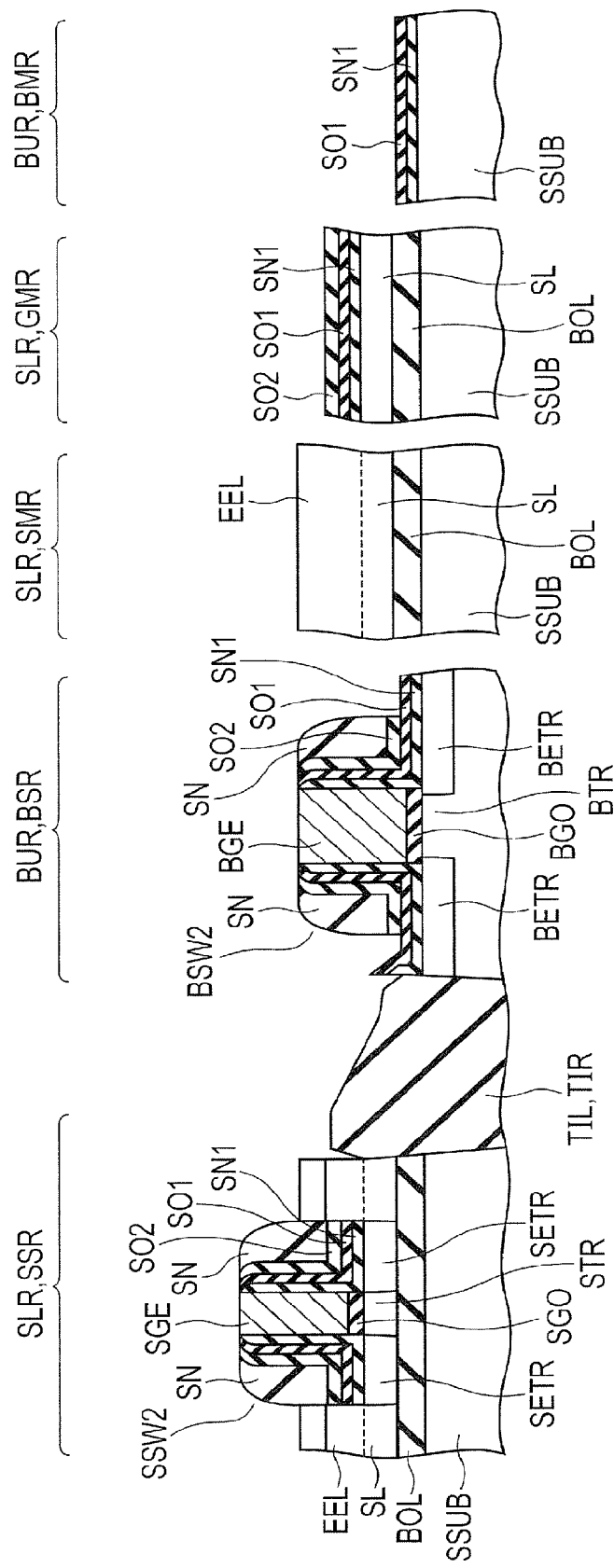
FIG. 16 is a sectional view illustrating a step performed after the step illustrated in FIG. 15, according to the embodiment.

Subsequently, the extension region BETR (see FIG. 16) is formed in the bulk transistor formation region BSR. Subsequently, a silicon nitride film (not illustrated) is formed to cover the gate electrodes SGE and BGE, the offset spacer film OSS, and the like. Subsequently, in the core transistor formation region SSR, a sidewall insulating film SSW2 including the silicon nitride film SN is formed over the side wall surface of the gate electrode SGE by performing an anisotropic etching process on the silicon nitride film, as illustrated in FIG. 16. In the bulk transistor formation region BSR, a sidewall insulating film BSW2 including the silicon nitride film SN is formed over the side wall surface of the gate electrode BGE.

Subsequently, a resist pattern (not illustrated), which covers the bulk transistor formation region BSR and exposes the core transistor formation region SSR, is formed by performing a predetermined photoengraving process. Subsequently, impurities are implanted into the core transistor formation region SSR by using the resist pattern as an implantation mask. Thereafter, the resist pattern is removed.

Subsequently, a resist pattern (not illustrated), which exposes the bulk transistor formation region BSR and covers the core transistor formation region SSR, is formed by performing a predetermined photoengraving process. Subsequently, impurities are implanted into the bulk transistor formation region BSR by using the resist pattern as an implantation mask. Thereafter, the resist pattern is removed.

Figure 17:
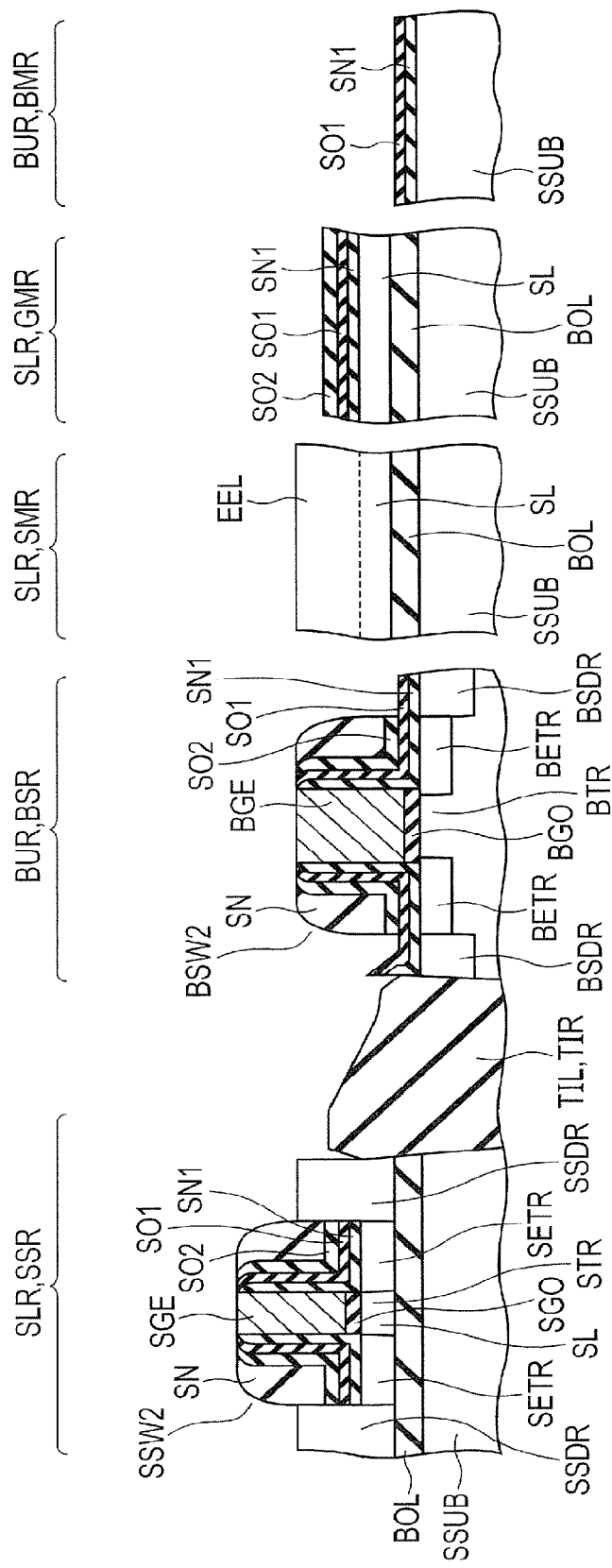
FIG. 17 is a sectional view illustrating a step performed after the step illustrated in FIG. 16, according to the embodiment.

Thereby, in the core transistor formation region SSR, the source/drain region SSDR is formed in the elevated epitaxial layer EEL, etc., as illustrated in FIG. 17.
In the bulk transistor formation region BSR, the source/drain region BSDR is formed in the silicon substrate SSUB.

Figure 18:
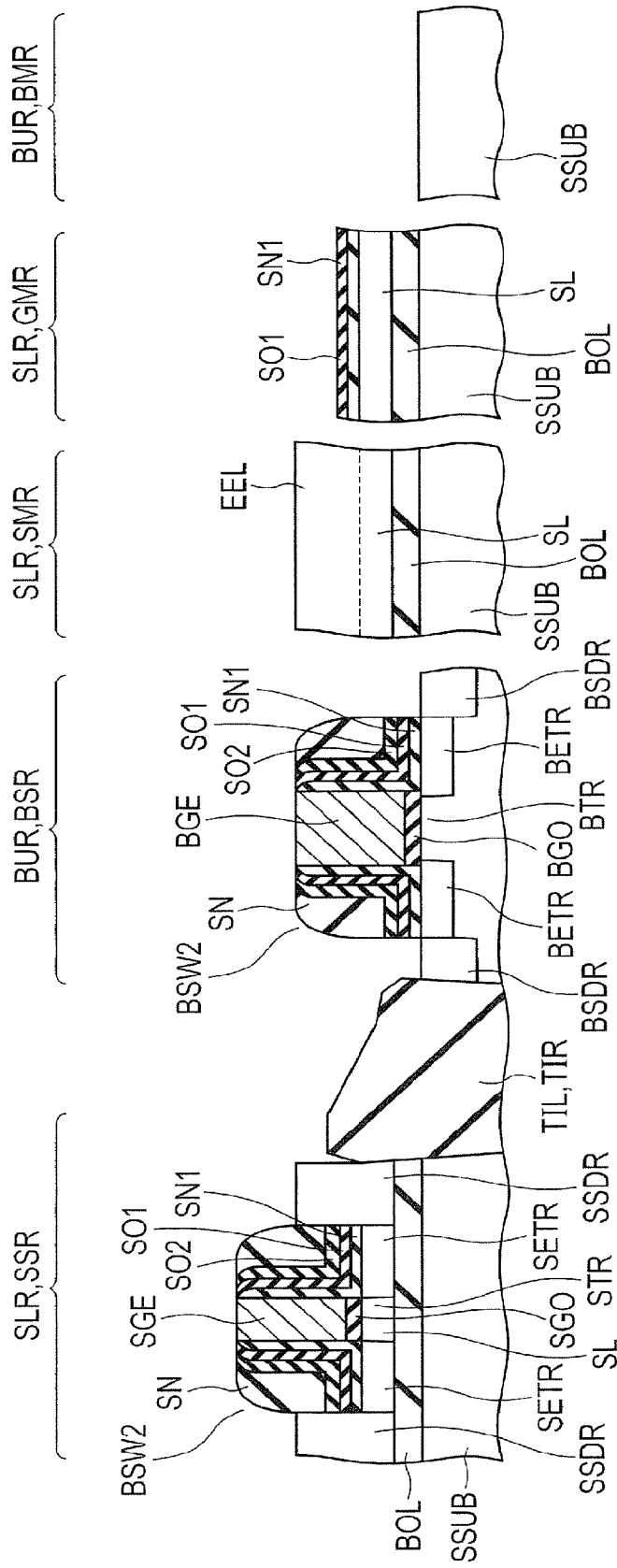
FIG. 18 is a sectional view illustrating a step performed after the step illustrated in FIG. 17, according to the embodiment.

Subsequently, a silicide protection film (not illustrated) for preventing the formation of a metal silicide film is formed. Subsequently, the surface of each of the elevated epitaxial layer in the core transistor formation region SSR and the silicon substrate SSUB in the bulk region BUR is exposed by performing predetermined photoengraving process and etching process, as illustrated in FIG. 18. At the time, the thickness of the silicon oxide film SO1 left over the surface of the silicon layer SL is reduced in the offset monitor region GMR. The surface of the silicon substrate SSUB is exposed in the bulk monitor region BMR.

Figure 19:
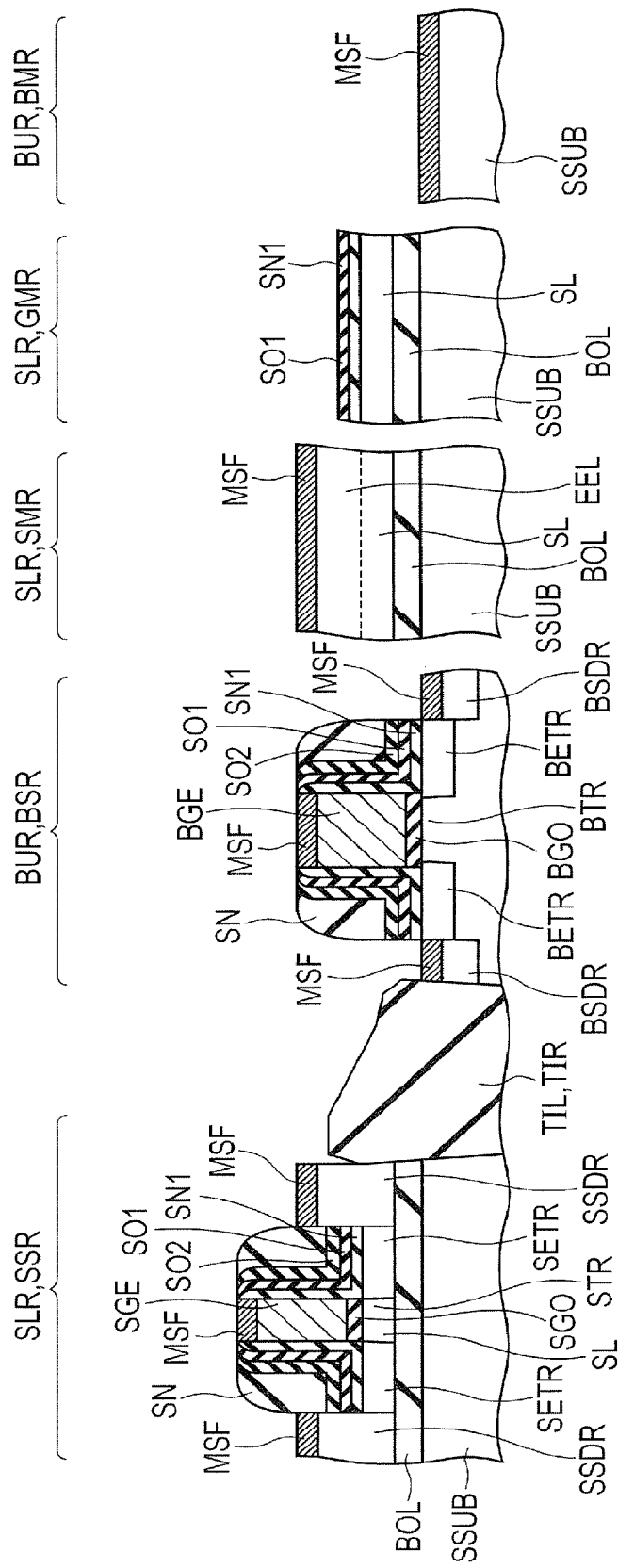
FIG. 19 is a sectional view illustrating a step performed after the step illustrated in FIG. 18, according to the embodiment.

Subsequently, the metal silicide film MSF including, for example, a cobalt silicide film or the like, is formed by a silicide (SALICIDE: Self-Aligned siLICIDE) process, as illustrated in FIG. 19. In the core transistor formation region SSR, the metal silicide film MSF is formed over the surface of each of the exposed source/drain region SSDR (elevated epitaxial layer EEL) and the gate electrode SGE.

In the bulk transistor formation region BSR, the metal silicide film MSF is formed over the surface of each of the exposed source/drain region BSDR and the gate electrode BGE. In the SOI monitor region SMR, the metal silicide film MSF is formed over the surface of the exposed elevated epitaxial layer EEL. In the bulk monitor region BMR, the metal silicide film MSF is formed over the surface of the exposed silicon substrate SSUB.

Figure 20:
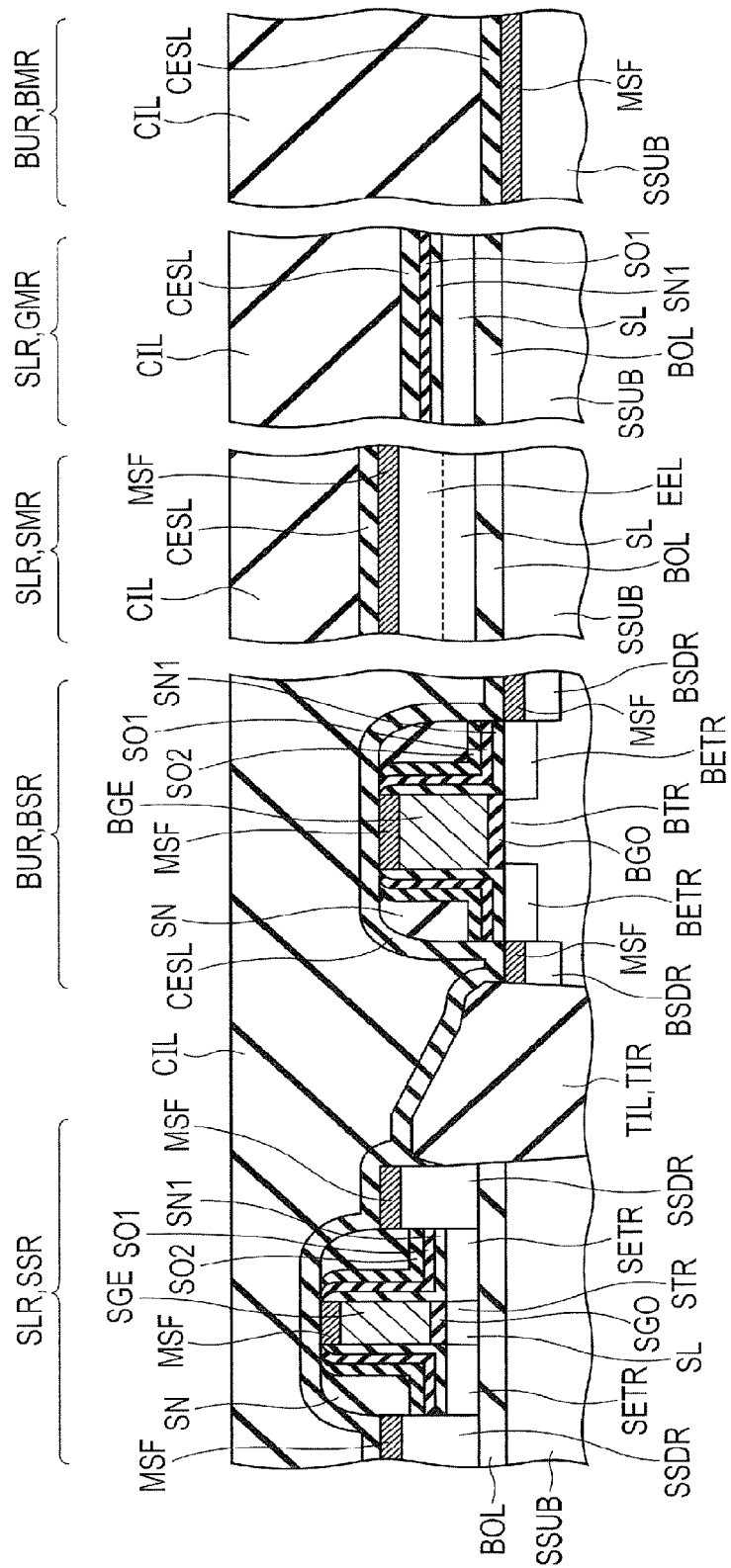
FIG. 20 is a sectional view illustrating a step performed after the step illustrated in FIG. 19, according to the embodiment.

Subsequently, the silicon nitride film CESL is formed to cover the metal silicide film MSF, as illustrated in FIG. 20. Subsequently, the contact interlayer insulating films CIL including, for example, a silicon oxide film or the like, is formed to cover the silicon nitride film CESL. Subsequently, contact holes (not illustrated), which expose the metal silicide film MSF, are formed by performing predetermined photoengraving process and etching process.

Figure 21:
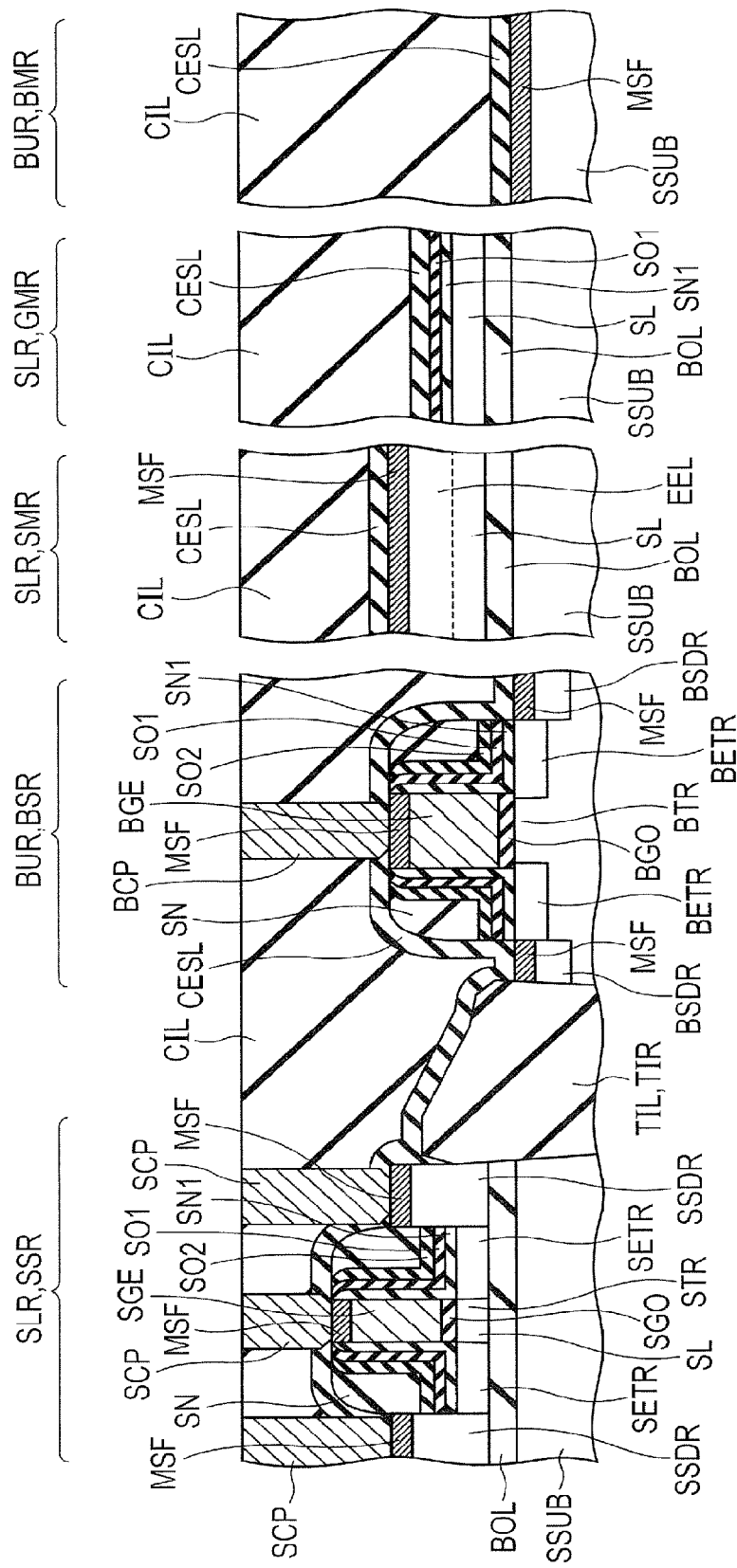
FIG. 21 is a sectional view illustrating a step performed after the step illustrated in FIG. 20, according to the embodiment.

Subsequently, the contact plugs SCP and BCP (see FIG. 21) are formed in the contact holes, respectively. In the core transistor formation region SSR, the contact plug SCP that contacts the metal silicide film MSF is formed, as illustrated in FIG. 21. In the bulk transistor formation region BSR, the contact plug BCP that contacts the metal silicide film MSF is formed.

Figure 22:
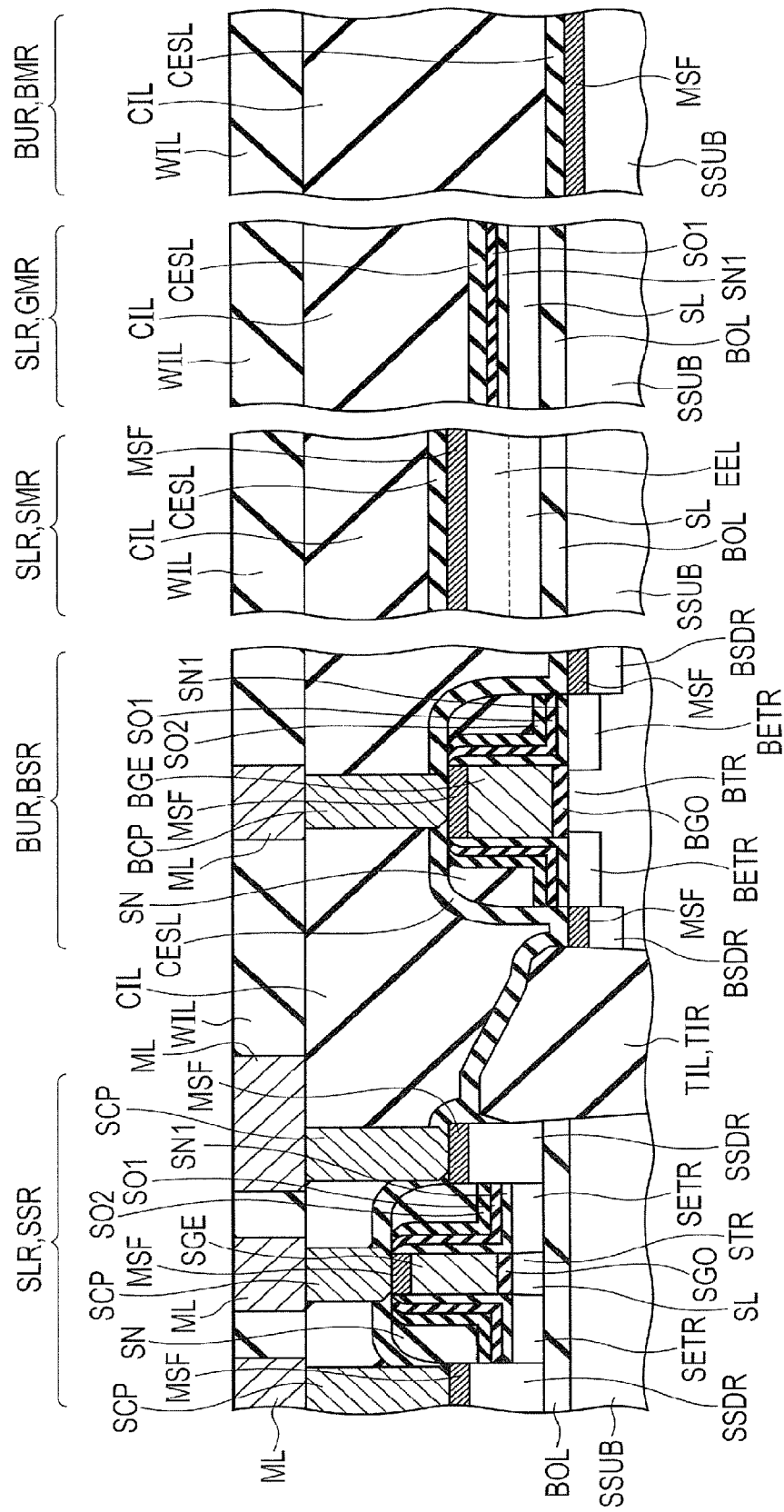
FIG. 22 is a sectional view illustrating a step performed after the step illustrated in FIG. 21, according to the embodiment.

Subsequently, the wiring interlayer insulating film WIL is formed to cover the contact interlayer insulating film CIL, as illustrated in FIG. 22. Subsequently, the wire ML is formed in the wiring interlayer insulating film WIL by using, for example, a damascene process. In the core transistor formation region SSR, the wire ML that contacts the contact plug SCP is formed. In the bulk transistor formation region BSR, the wire ML that contacts the contact plug BCP is formed. Thereafter, the multi-layer wiring structure including the multi-layer wire MLS and the multilayer interlayer insulating film MIL is formed, if necessary, and thereby the main part of the semiconductor device, illustrated in FIG. 3, is completed.

In the semiconductor device described above, the thickness of the insulating film formed in the offset monitor region GMR is managed as the thickness of the offset spacer film OSS in the core transistor formation region SSR. Thereby, a variation in the extension implantation can be suppressed. This will be described in comparison with a semiconductor device of a comparative example.

Figure 23:
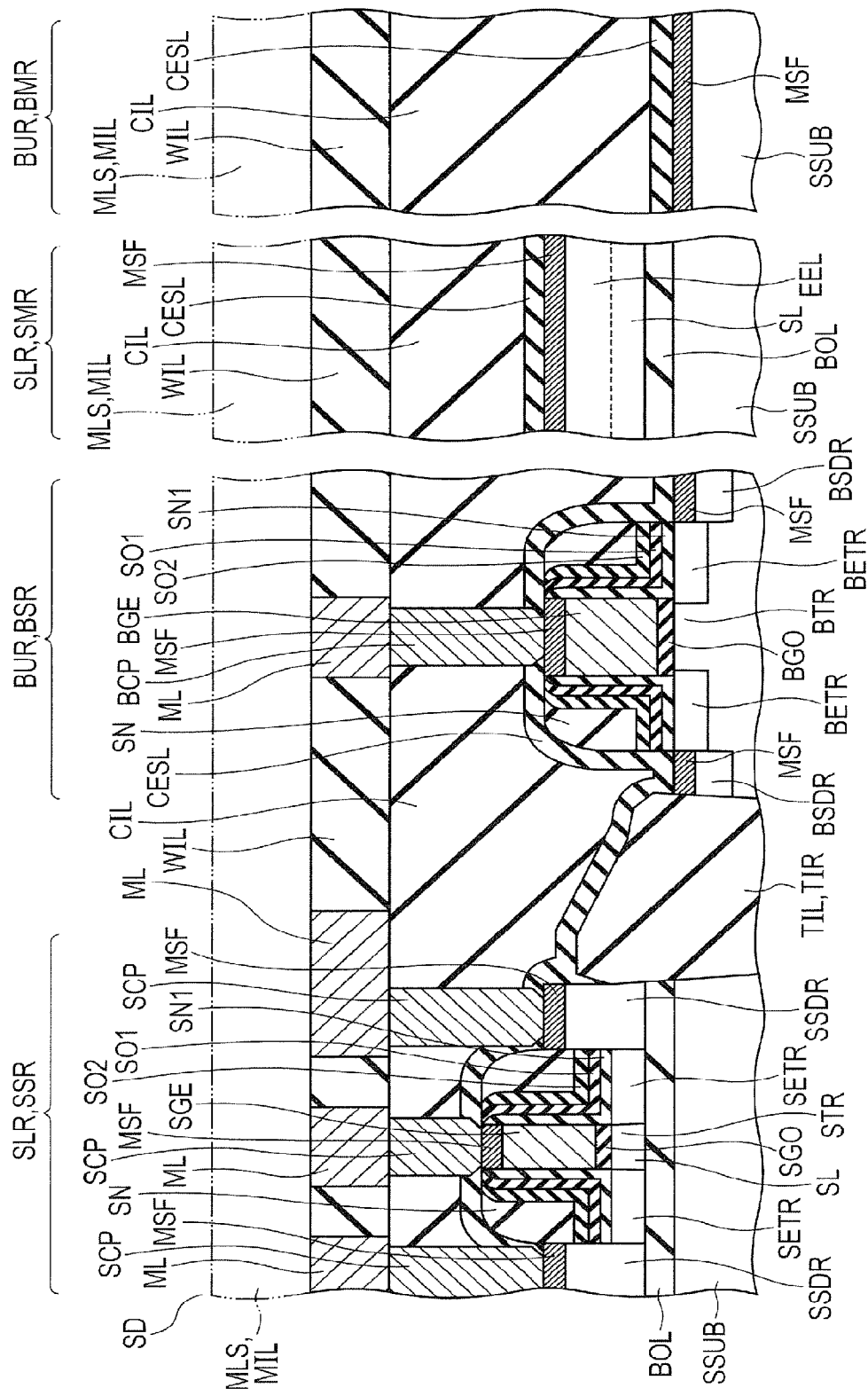
FIG. 23 is a sectional view of a semiconductor device of a comparative example.

A semiconductor device SD of a comparative example is illustrated in FIG. 23. In the semiconductor device SD of the comparative example, an SOI monitor region SMR and a bulk monitor region BMR are formed as thickness monitor regions, as illustrated in FIG. 23. The semiconductor device SD of the comparative example is similar to the semiconductor device illustrated in FIG. 3, except that the offset monitor region is not formed; and hence the same members are denoted with the same symbols and description thereof is not repeated, unless it is necessary.

In the semiconductor device of the comparative example, the thickness of the epitaxial layer formed in the SOI monitor region SMR is managed as the thickness of the elevated epitaxial layer EEL of the SOTB transistor STR. The thickness of the silicon oxide film formed in the bulk monitor region BMR is managed as the thickness of the gate oxide film of the bulk transistor. Further, the thickness of the insulating film formed in the bulk monitor region BMR, the insulating film being to serve as an offset spacer film, is managed as the thickness of the offset spacer film of the SOTB transistor STR.

Figure 24:
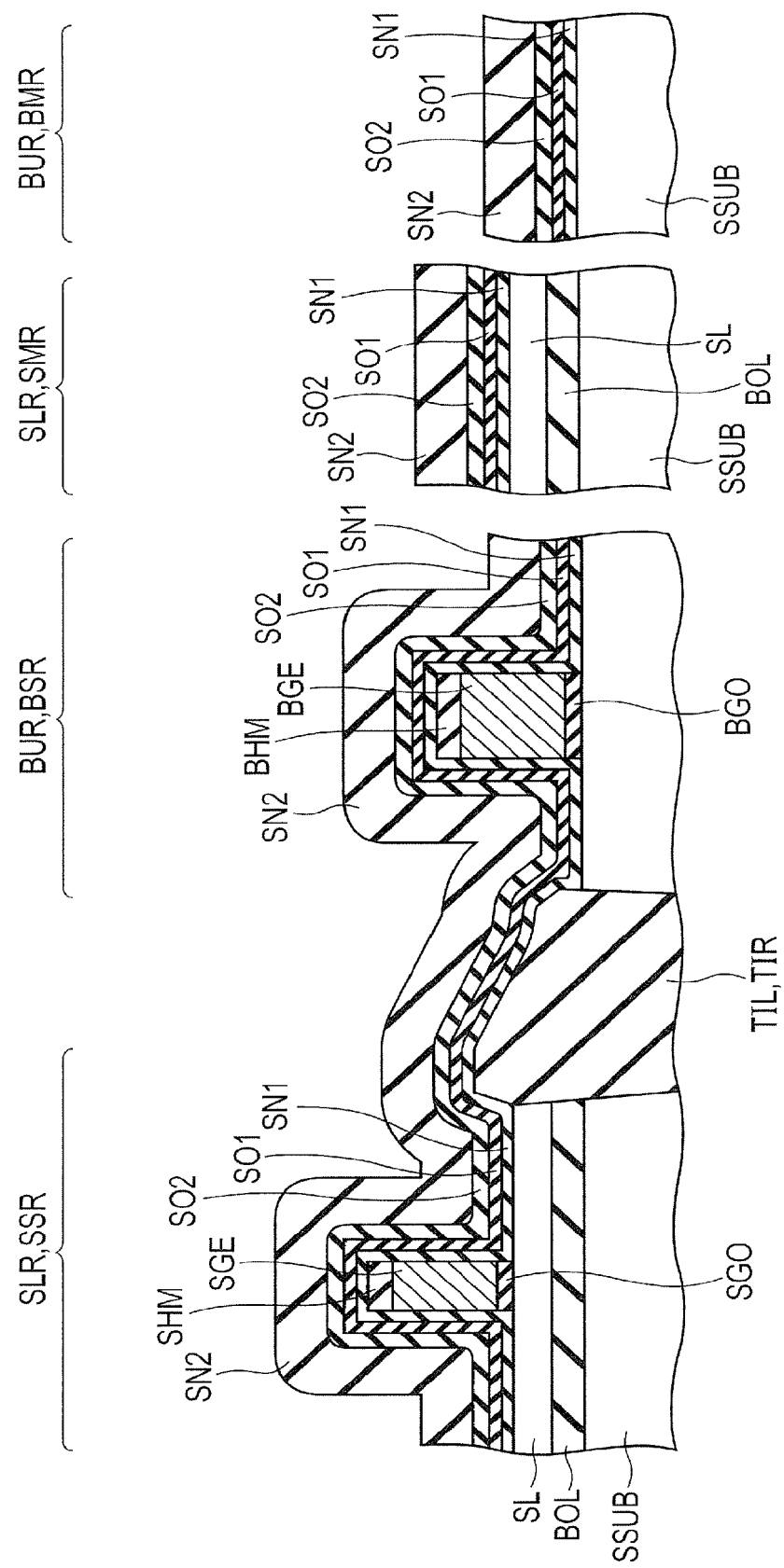
FIG. 24 is a sectional view illustrating one step of a manufacturing method of the semiconductor device of the comparative example.
Figure 25:
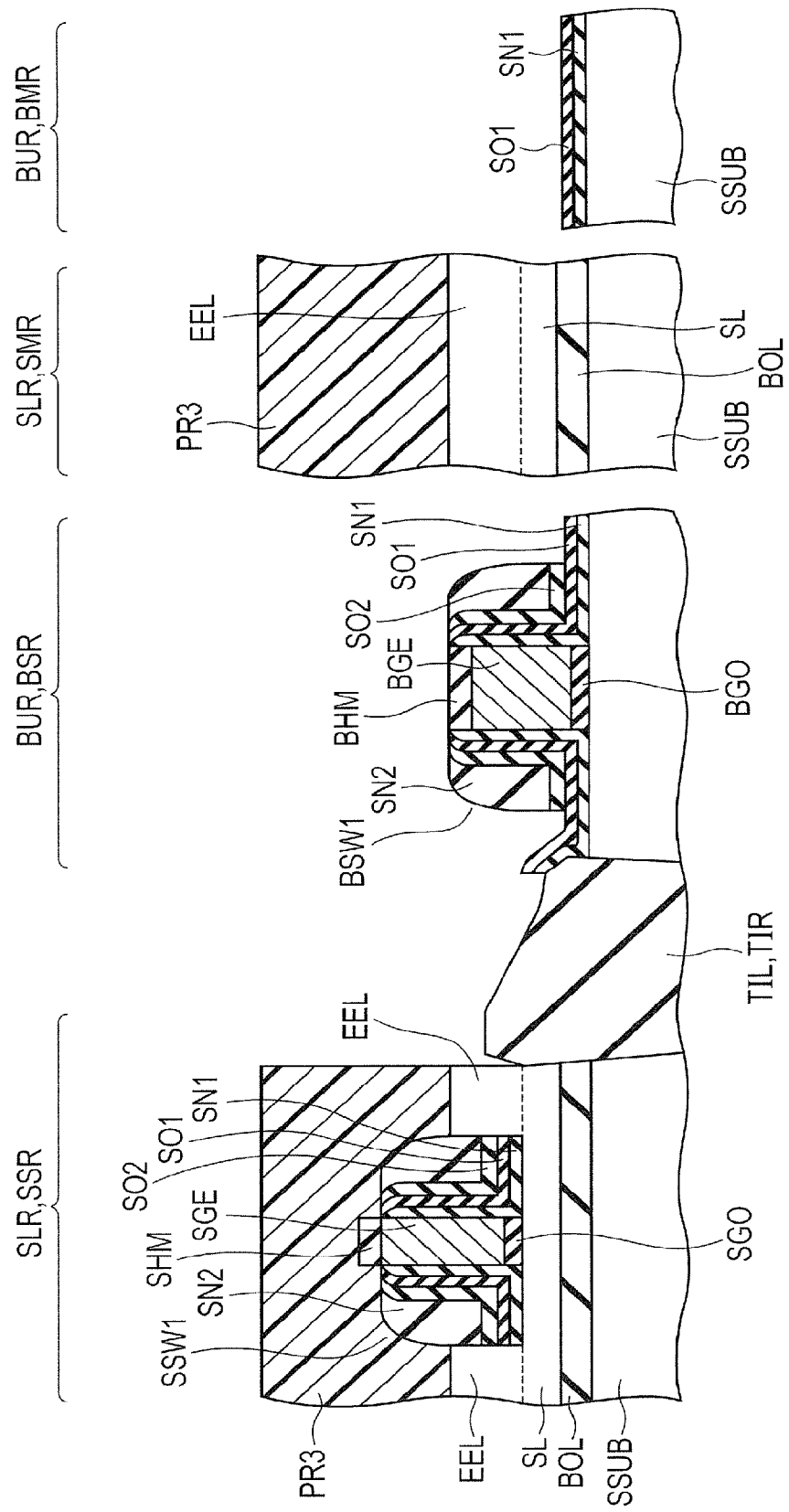
FIG. 25 is a sectional view illustrating a step performed after the step illustrated in FIG. 24.

Subsequently, a manufacturing method of the semiconductor device SD of the comparative example will be described. After the steps similar to those illustrated in FIGS. 4 to 10 are first performed, an insulating film (silicon nitride film SN1, silicon oxide film SO1, and silicon oxide film SO2), which will serve as an offset spacer film, and the silicon nitride film SN2 are formed in the bulk monitor region BMR, as illustrated in FIG. 24. Subsequently, after the steps similar to those illustrated in FIGS. 11 to 13 are performed, the sidewall insulating film BSW1 is formed in the bulk transistor formation region BSR, as illustrated in FIG. 25.

At this time, the silicon nitride film SN2 and the silicon oxide film SO2, etc., are removed in the bulk monitor region BMR. Accordingly, the thickness of the insulating film left in the bulk monitor region BMR becomes different from that of the offset spacer film of the SOTB transistor STR. That is, in the semiconductor device of the comparative example, the thickness of the insulating film to serve as the offset spacer film varies by the manufacturing steps after a step in which the insulating film to serve as the offset spacer film is formed, in the bulk monitor region BMR.

Figure 26:
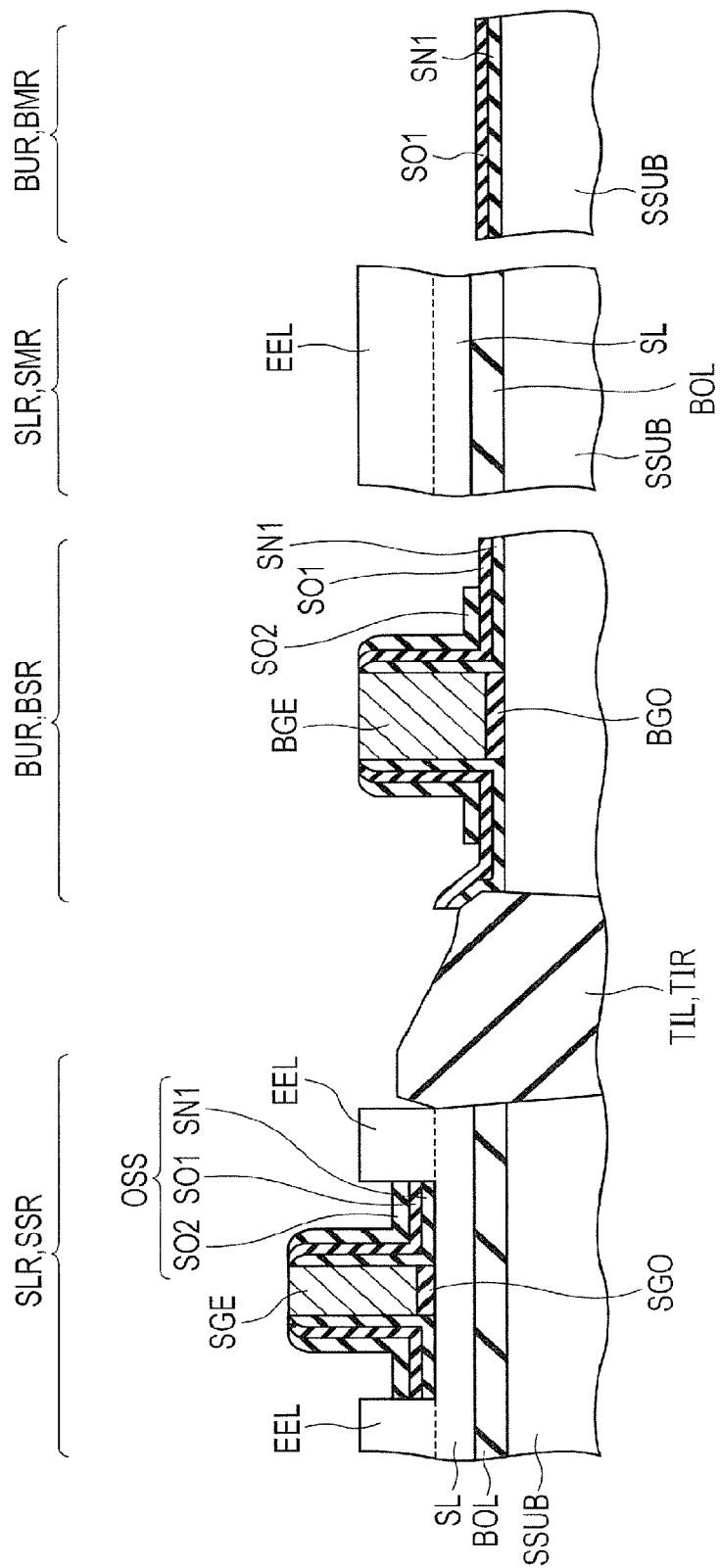
FIG. 26 is a sectional view illustrating a step performed after the step illustrated in FIG. 25.

Subsequently, the offset spacer film OSS is exposed by removing the left silicon nitride film SN2 in the core transistor formation region SSR, as illustrated in FIG. 26. Subsequently, the thickness of the insulating film (silicon nitride film SN1 and silicon oxide film SO1) left in the bulk monitor region BMR is measured. The implantation conditions for the extension implantation are set by comparing the measured thickness with the standard thickness, thereby allowing the extension region to be formed. Thereafter, the steps similar to those illustrated in FIGS. 16 to 22 are performed, and then the main part of the semiconductor device of the comparative example, illustrated in FIG. 23, is completed.

In the semiconductor device of the comparative example, the implantation conditions for the extension implantation are managed by the thickness of the insulating film (silicon nitride film SN1 and silicon oxide film SO1) left in the bulk monitor region BMR. In the bulk monitor region BMR, however, the thickness of the insulating film to serve as the offset spacer film varies by the manufacturing steps performed between the formation of the insulating film and the step immediately before the extension implantation is performed (step of measuring the thickness of the insulating film). As described above, part of the insulating film left in the bulk monitor region BMR is etched, for example, when the sidewall insulating film BSW1 is formed over the side wall surface of the gate electrode BGE.

Accordingly, the measured thickness of the insulating film does not correspond to the thickness of the offset spacer film OSS actually formed in the core transistor formation region SSR. So, the implantation conditions for the extension implantation become different from predetermined ones, and hence the desired extension region SETR cannot be formed.

Herein, a portion (offset portion) of the offset spacer film OSS, the portion being located in the side wall surface of the gate electrode SGE, has an influence on the overlap length, in plan view, between the extension region SETR and the gate electrode SGE. Additionally, a portion (through portion) of the offset spacer film OSS, the portion being located in the surface of the silicon layer SL, has an influence on the impurity concentration (resistance) of the extension region SETR.

In the semiconductor device according to an embodiment, the offset monitor region GMR is formed, unlike the semiconductor device of the comparative example. In the offset monitor region GMR, an influence, such as one in which the insulating film may be etched, is not exerted between the step (FIG. 10) of forming the insulating film (silicon nitride film SN1 and silicon oxide films SO1 and SO2), which will serve as the offset spacer film, and the step (FIG. 14) immediately before the extension implantation is performed. For example, even when the sidewall insulating film BSW1 is formed over the side wall surface of the gate electrode BGE, the insulating film formed in the offset monitor region GMR is not etched because the resist pattern PR3 is formed to cover the insulating film.

Accordingly, the thickness of the insulating film formed in the offset monitor region GMR becomes approximately equal to that of the offset spacer film OSS in the core transistor formation region SSR. Thereby, the thickness of the insulating film formed in the offset monitor region GMR can be managed as the thickness of the offset spacer film OSS (thickness of the offset portion, thickness of the through portion). The thickness of the insulating film formed in the offset monitor region GMR is measured, so that the implantation conditions for the extension implantation are set based on the measured thickness. Herein, the thickness of the offset portion and that of the through portion are handled as the same thickness.

Figure 27:
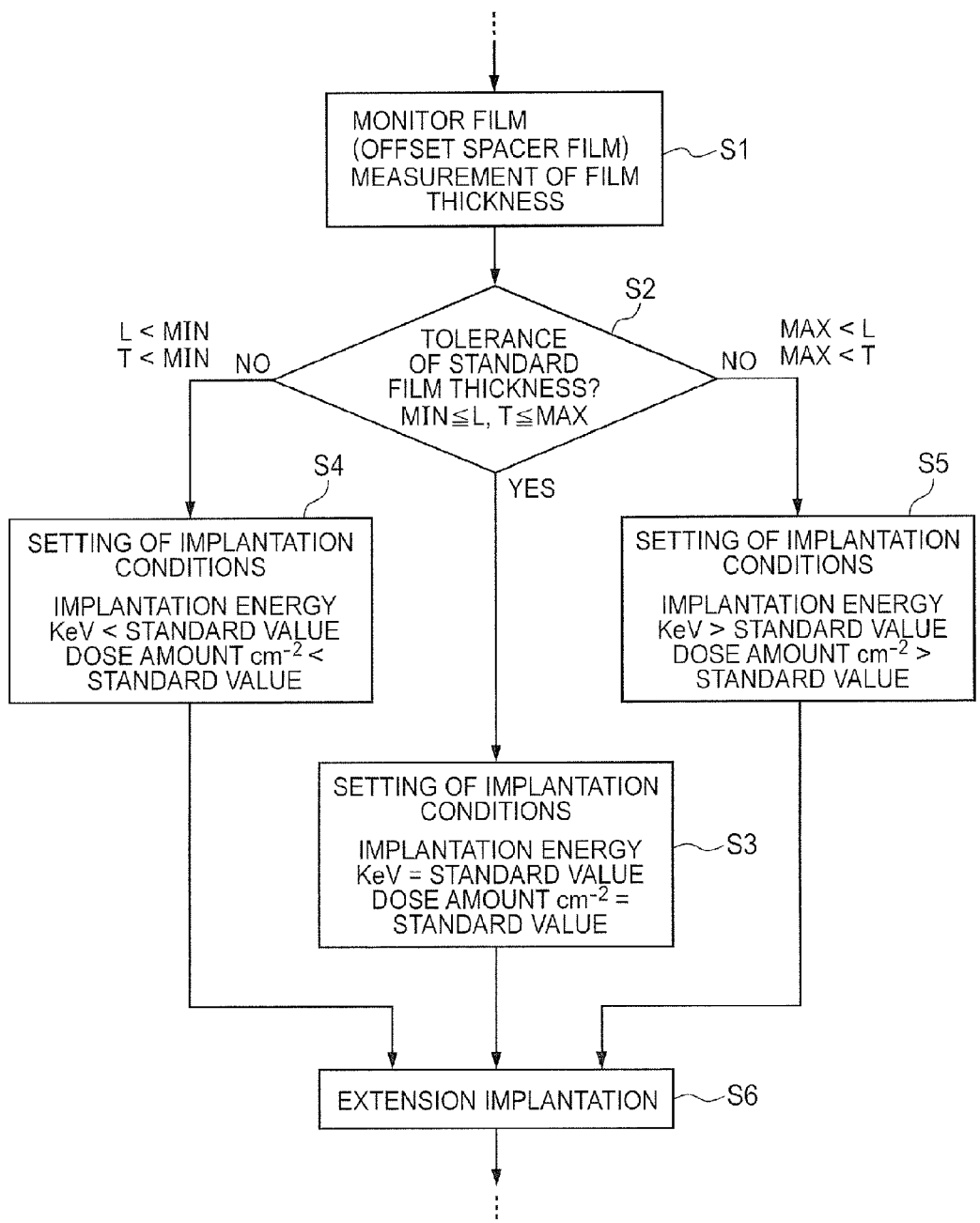
FIG. 27 is a view illustrating a flowchart in which a method of setting implantation conditions is illustrated, according to the embodiment.

Subsequently, a flow of setting the implantation conditions for the extension implantation will be described. As illustrated in FIG. 27, the thickness of the insulating film formed in the offset monitor region GMR (thickness L of the offset portion, thickness T of the through portion) is measured in Step S1. Subsequently, it is determined whether the measured thickness (L, T) is within the tolerance of the standard thickness in Step S2. When the measured thickness (L, T) is within the tolerance thereof, standard implantation energy (standard value) is set as the implantation energy and a standard dose amount (standard value) is set as the dose amount in Step S3.

On one hand, when the measured thickness (L, T) is smaller than the standard thickness (minimum thickness), implantation energy lower than the standard value is set as the implantation energy and a dose amount lower than the standard value is set as the dose amount in Step S4. On the other hand, when the measured thickness (L, T) is larger than the standard thickness (maximum thickness), implantation energy higher than the standard value is set as the implantation energy and a dose amount higher than the standard value is set as the dose amount in Step S5.

Subsequently, impurities are implanted under the set implantation condition in Step S6, so that the extension region SETR is formed in the silicon layer SL. This method of setting the implantation conditions is referred to as APC (Auto Process Control).

Figure 28:
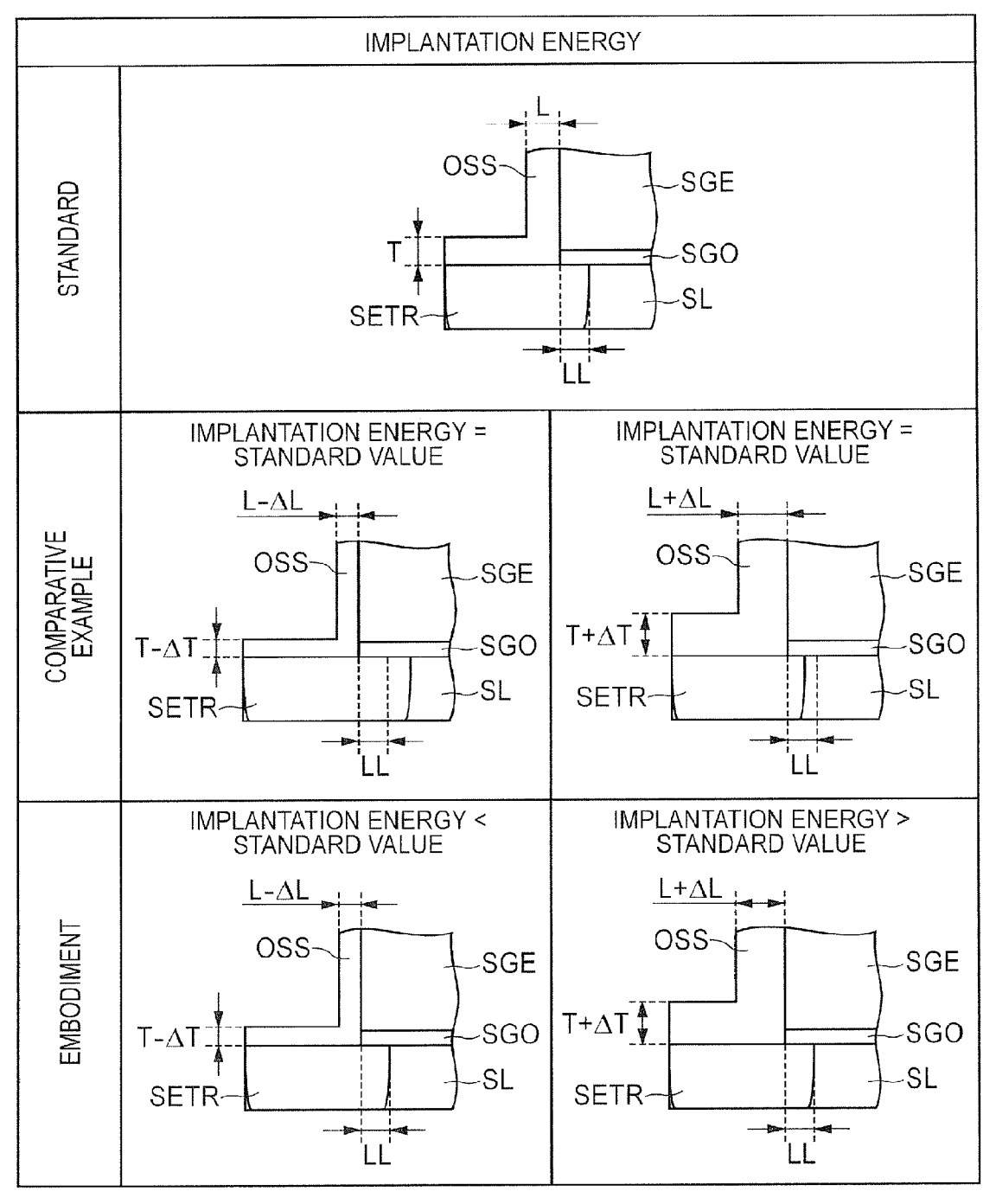

Subsequently, the method of setting implantation energy will be described in more detail. The extension region SETR, which is formed when the thickness (L, T) of the actual offset spacer film OSS is within the tolerance and formed under the standard implantation energy, will be first described. In this case, the overlap length between the extension region SETR and the gate electrode SGE is set to be a length LL (standard value), as illustrated in the upper row of FIG. 28.

Subsequently, the case, for example, where, although it is determined that the measured thickness is within the tolerance, the thickness of the offset spacer film OSS, which is actually formed over the side wall surface of the gate electrode SGE, etc., is smaller than the minimum thickness (L−ΔL, T−ΔT), will be described as one example of a comparative example.

In this case, the extension region SETR is formed with the standard implantation energy, although the actual thickness (L−ΔL) of the offset portion is smaller than the minimum thickness. Accordingly, the overlap length between the extension region SETR and the gate electrode SGE becomes larger than the standard value (LL), as illustrated on the left side of the middle row of FIG. 28.

Subsequently, the case, for example, where, although it is determined that the measured thickness is within the tolerance, the thickness of the offset spacer film OSS, which is actually formed over the side wall surface of the gate electrode SGE, etc., is lager than the maximum thickness (L+ΔL, T+ΔT), will be described as another example of the comparative example.

In this case, the extension region SETR is formed with the standard implantation energy, although the actual thickness (L+ΔL) of the offset portion is larger than the maximum thickness. Accordingly, the overlap length between the extension region SETR and the gate electrode SGE becomes smaller than the standard value (LL), as illustrated on the right side of the middle row of FIG. 28.

In the embodiment, an insulating film, including the same films as those of the offset spacer film OSS in the core transistor formation region SSR, is formed in the offset monitor region GMR, and the thickness of the insulating film is measured, unlike the comparative example.

Thereby, when it is determined that the measured thickness is smaller than the minimum thickness (L−ΔL, T−ΔT), it is determined that the thickness of the offset spacer film OSS actually formed over the side wall surface of the gate electrode SGE, etc., is smaller than the minimum thickness. In this case, the implantation energy is set to a value lower than the standard value. By forming the extension region SETR with implantation energy lower than the standard value, the overlap length between the extension region SETR and the gate electrode SGE can be made equal to the standard length (LL), as illustrated on the left side of the lower row of FIG. 28.

On the other hand, when it is determined that the measured thickness is larger than the maximum thickness (L+ΔL, T+ΔT), it is determined that the thickness of the offset spacer film OSS actually formed over the side wall surface of the gate electrode SGE, etc., is larger than the maximum thickness. In this case, the implantation energy is set to a value higher than the standard value. By forming the extension region SETR with implantation energy higher than the standard value, the overlap length between the extension region SETR and the gate electrode SGE can be made equal to the standard length (LL), as illustrated on the right side of the lower row of FIG. 28.

A variation in the characteristics of the SOTB transistor can be suppressed by thus making the overlap length between the extension region SETR and the gate electrode SGE equal to the standard length (LL).

Subsequently, a method of setting a dose amount will be described in more detail. The extension region SETR, which is formed when the thickness (L, T) of the actual offset spacer film OSS is within the tolerance and formed under the standard dose amount, will be first described. In this case, the resistance of the extension region SETR is set to R (standard value), as illustrated in the upper row of FIG. 29.

Subsequently, the case, for example, where, although it is determined that the measured thickness is within the tolerance, the thickness of the offset spacer film OSS actually formed over the surface of the silicon layer SL, etc., is smaller than the minimum thickness (L−ΔL, T−ΔT), will be described as one example of the comparative example.

In this case, the extension region SETR is formed with the standard dose amount, although the actual thickness (T−ΔT) of the through portion is smaller than the minimum thickness. Accordingly, the impurity concentration of the extension region SETR becomes high and the resistance (R−ΔR) thereof becomes lower than the standard value (R), as illustrated on the left side of the middle row of FIG. 29.

Subsequently, the case, for example, where, although it is determined that the measured thickness is within the tolerance, the thickness of the offset spacer film OSS actually formed over the surface of the silicon layer SL, etc., is larger than the maximum thickness value (L+ΔL, T+ΔT), will be described as another example of the comparative example.

In this case, the extension region SETR is formed with the standard dose amount, although the actual thickness (T+ΔT) of the through portion is larger than the maximum thickness. Accordingly, the impurity concentration of the extension region SETR becomes low and the resistance (R+ΔR) thereof becomes higher than the standard value (R), as illustrated on the right side of the middle row of FIG. 29.

In the embodiment, an insulating film, including the same films as those of the offset spacer film OSS in the core transistor formation region SSR, is formed in the offset monitor region GMR, and the thickness of the insulating film is measured, unlike the comparative example.

Thereby, when it is determined that the measured thickness is smaller than the minimum thickness (L−ΔL, T−ΔT), it is determined that the thickness of the offset spacer film OSS actually formed over the surface of the silicon layer SL, etc., is smaller than the minimum thickness. In this case, the dose amount is set to a value lower than the standard value. By forming the extension region SETR with a dose amount lower than the standard value, the resistance of the extension region SETR can be made equal to the standard resistance value (R), as illustrated on the left side of the lower row of FIG. 29.

On the other hand, when it is determined that the measured thickness is larger than the maximum thickness (L+ΔL, T+ΔT), it is determined that the thickness of the offset spacer film OSS actually formed over the surface of the silicon layer, etc., is larger than the maximum thickness. In this case, the dose amount is set to a value higher than the standard value. By forming the extension region SETR with a dose amount higher than the standard value, the resistance of the extension region SETR can be made equal to the standard resistance value (R), as illustrated on the right side of the lower row of FIG. 29.

A variation in the characteristics of the SOTB transistor can be suppressed by thus making the resistance of the extension region SETR equal to the standard resistance value (R).

In the above method of setting implantation conditions, there is little difference between the thickness of the insulating film (silicon nitride film SN1, silicon oxide film SO1, and silicon oxide film SO2) formed in the offset monitor region GMR, the insulating film including the same films as those of the offset spacer film OSS, and the thickness of the offset spacer film OSS actually formed over the side wall surface of the gate electrode SGE and the surface of the silicon layer SL.

Accordingly, a variation in the measured thickness with respect to the thickness of the actual offset spacer film is suppressed, and hence the thickness of the offset spacer film OSS actually formed over the side wall surface of the gate electrode SGE and the surface of the silicon layer SL can be known by measuring the thickness of the insulating film formed in the offset monitor region GMR. Thereby, implantation energy and a dose amount can be set to the conditions under which a desired extension region is formed, in accordance with the measured thickness.

As a result, the overlap length between the extension region SETR and the gate electrode SGE can be made equal to the standard length (LL) and the resistance of the extension region SETR can be made equal to the standard resistance value (R), thereby allowing a variation in the characteristics of the SOTB transistor to be suppressed.

In the embodiment described above, the case, in which the SOI monitor region SMR, the offset monitor region GMR, and the bulk monitor region BMR are arranged in a chip, has been described as an example (see FIGS. 1 and 2).

Figure 30:
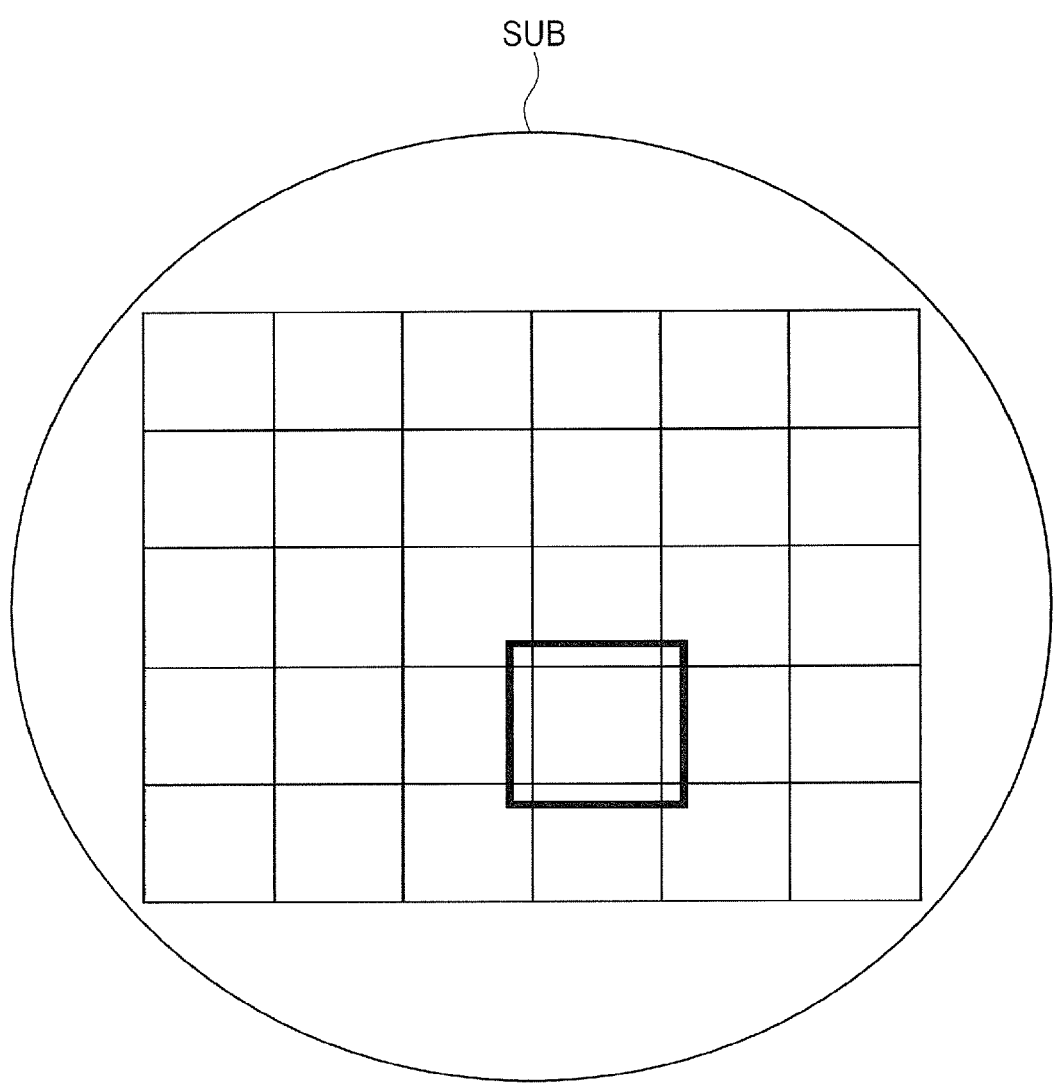
FIG. 30 is a plan view illustrating another example of the arrangement of semiconductor devices in an SOI substrate, according to one variation of the embodiment.
Figure 31:
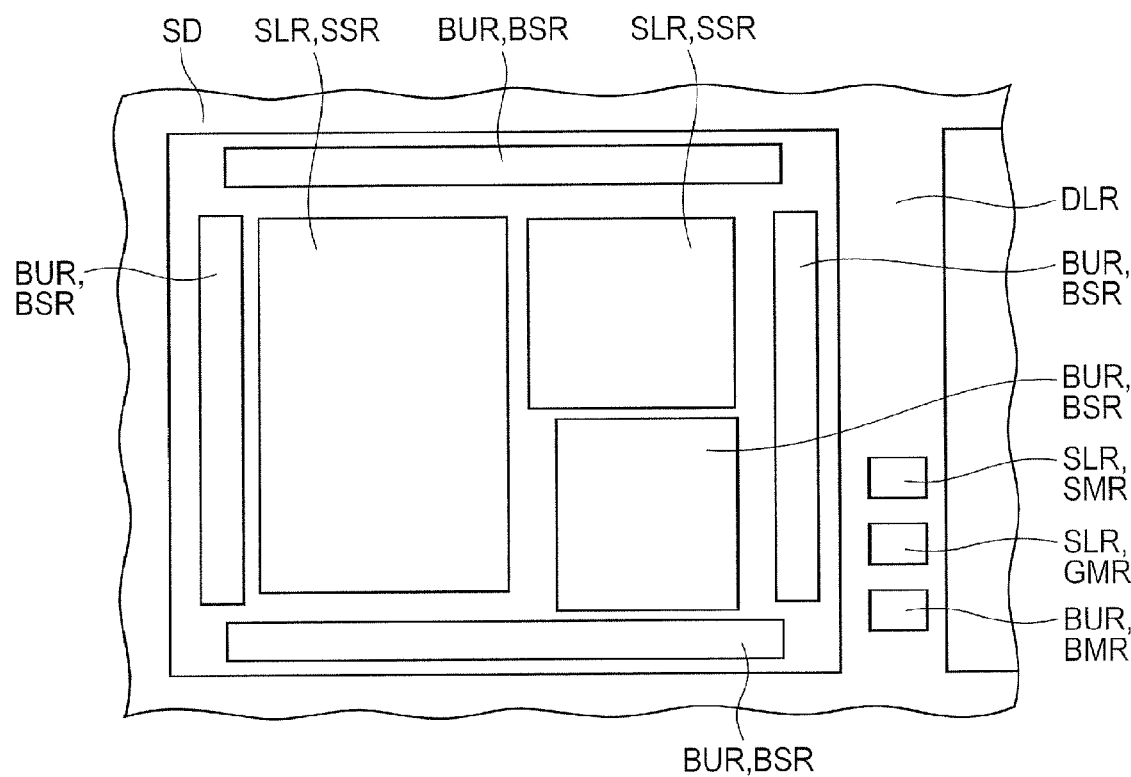
FIG. 31 is a plan view illustrating one example of the layout of both a semiconductor device as a chip in the heavy-lined frame illustrated in FIG. 30 and the periphery thereof, according to the embodiment.

In a semiconductor device, besides such an arrangement, the SOI monitor region SMR, the offset monitor region GMR, and the bulk monitor region BMR may be arranged, for example, in a dicing line DLR, as illustrated, for example, In FIGS. 30 and 31. In such an arrangement, desired implantation conditions (implantation energy, dose amount) can be set in accordance with a thickness by measuring the thickness of the insulating film formed in the offset monitor region GMR.

In the embodiment described above, the case, in which the offset monitor region GMR is arranged in the SOI region SLR, has been described as an example. In a semiconductor device, the offset monitor region GMR may be arranged in the bulk region BUR.

Figure 32:
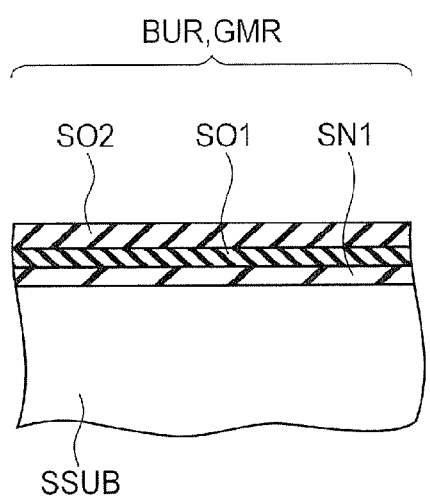
FIG. 32 is a partial sectional view illustrating one step of a manufacturing method of a semiconductor device according to another variation of the embodiment.

In such a case, the thickness of the offset spacer film OSS (see FIG. 14) actually formed over the side wall surface of the gate electrode SGE, etc., can be known by measuring the total thickness of the silicon nitride film SN1, the silicon oxide film SO1, and the silicon oxide film SO2, which are formed to contact the surface of the silicon substrate SSUB located in the offset monitor region GMR, as illustrated in FIG. 32, in a step similar to that illustrated in FIG. 14.

Thereby, implantation energy and a dose amount can be set to the conditions under which a desired extension region is formed, in accordance with the measured thickness. As a result, a variation in the characteristics of the SOTB transistor can be suppressed.

Figure 33:
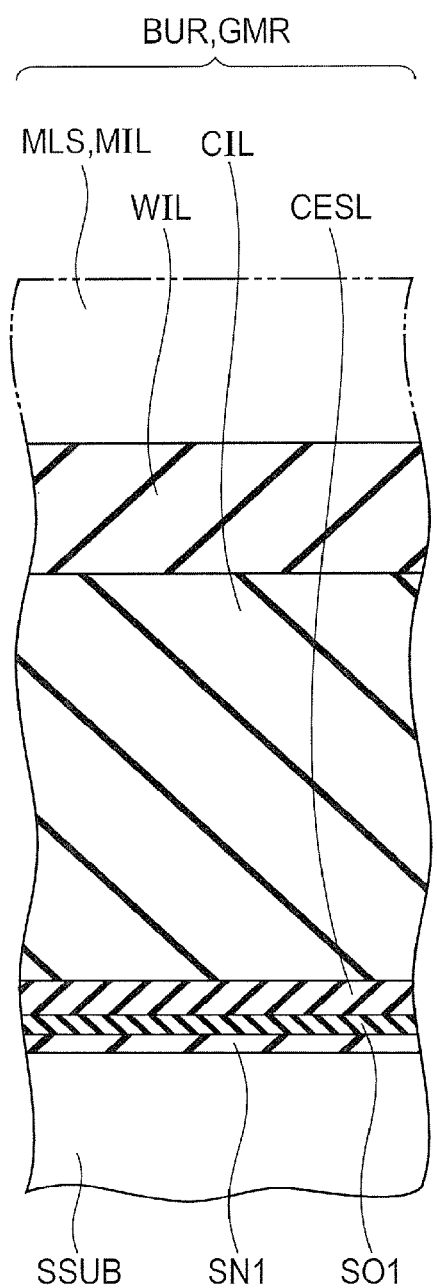
FIG. 33 is a partial sectional view of a semiconductor device according to another variation of the embodiment.

In this case, a structure is formed in the offset monitor region GMR in the bulk region BUR in the completed semiconductor device, in which at least the silicon nitride film SN1, and the like that contact the surface of the silicon substrate SSUB are left, as illustrated in FIG. 33.

In the semiconductor device described in the embodiment, elements can be variously combined, if necessary.

The invention made by the present inventors has been specifically described above based on preferred embodiments, but the invention should not be limited to the preferred embodiments, and it is needless to say that various modifications may be made to the invention within a range not departing from the gist of the invention.

What is claimed is:

1. A semiconductor device comprising:
    a substrate having a semiconductor substrate and a semiconductor layer formed over the surface of the semiconductor substrate by interposing a buried insulating film;
    a plurality of regions including a first element formation region and a first monitor region that are defined in the semiconductor layer;
    a first transistor that is formed in the first element formation region and includes a first gate electrode, an extension region, and a first impurity region;
    an offset spacer film formed to cover the side wall surface of the first gate electrode and the extension region; and
    an interlayer insulating film formed to cover the first transistor,
    wherein in the first element formation region, the offset spacer film includes a first insulating film first part formed to contact the surface of each of the side wall surface of the first gate electrode and the extension region, and
    wherein in the first monitor region, a first insulating film second part is formed to contact the surface of the semiconductor layer.

2. The semiconductor device according to claim 1,
    wherein the plurality of regions includes a second element formation region defined in the semiconductor substrate, and
    wherein a second transistor, including a second gate electrode, a second extension region, and a second impurity region, is formed in the second element formation region.

3. The semiconductor device according to claim 2,
    wherein the plurality of regions includes a second monitor region defined in the semiconductor substrate, and
    wherein a metal silicide film is formed: over the surface of each of the first gate electrode and the first impurity region in the first element formation region; over the surface of each of the second gate electrode and the second impurity region in the second element formation region; and over the surface of the semiconductor substrate in the second monitor region.

4. The semiconductor device according to claim 1,
    wherein each of the first insulating film first part and the first insulating film second part includes a silicon nitride film.

* * * * *